(12) United States Patent
Kong et al.

(10) Patent No.: US 12,033,930 B2
(45) Date of Patent: Jul. 9, 2024

(54) SELECTIVELY ROUGHENED COPPER ARCHITECTURES FOR LOW INSERTION LOSS CONDUCTIVE FEATURES

(71) Applicant: Intel Corporation, Santa Clara, CA (US)

(72) Inventors: Jieying Kong, Chandler, AZ (US); Yiyang Zhou, Chandler, AZ (US); Suddhasattwa Nad, Chandler, AZ (US); Jeremy Ecton, Gilbert, AZ (US); Hongxia Feng, Chandler, AZ (US); Tarek Ibrahim, Mesa, AZ (US); Brandon Marin, Chandler, AZ (US); Zhiguo Qian, Chandler, AZ (US); Sarah Blythe, Chandler, AZ (US); Bohan Shan, Chandler, AZ (US); Jason Steill, Phoenix, AZ (US); Sri Chaitra Jyotsna Chavali, Chandler, AZ (US); Leonel Arana, Phoenix, AZ (US); Dingying Xu, Chandler, AZ (US); Marcel Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 773 days.

(21) Appl. No.: 17/033,392

(22) Filed: Sep. 25, 2020

(65) Prior Publication Data

US 2022/0102259 A1    Mar. 31, 2022

(51) Int. Cl.
*H01L 23/498* (2006.01)
*H01L 21/48* (2006.01)

(52) U.S. Cl.
CPC ...... *H01L 23/49838* (2013.01); *H01L 21/485* (2013.01); *H01L 23/49827* (2013.01)

(58) Field of Classification Search
CPC .................... H01L 23/49838; H01L 23/49822
See application file for complete search history.

(56) References Cited

U.S. PATENT DOCUMENTS

| | | | |
|---|---|---|---|
| 6,596,384 B1 | 7/2003 | Day et al. | |
| 10,051,746 B2 | 8/2018 | Harkness, Jr. et al. | |
| 2009/0092749 A1* | 4/2009 | Tachibana | H05K 3/4644 427/98.8 |
| 2016/0020163 A1* | 1/2016 | Shimizu | H05K 1/115 361/768 |
| 2016/0174372 A1* | 6/2016 | Inagaki | H01L 23/5384 174/251 |
| 2018/0211928 A1* | 7/2018 | Chang | H01L 23/49822 |

* cited by examiner

*Primary Examiner* — Sherman Ng
(74) *Attorney, Agent, or Firm* — Essential Patents Group, LLP

(57) ABSTRACT

An integrated circuit (IC) package substrate, comprising a metallization level within a dielectric material. The metallization level comprises a plurality of conductive features, each having a top surface and a sidewall surface. The top surface of a first conductive feature of the plurality of conductive features has a first average surface roughness, and the sidewall surface of a second conductive feature of the plurality of conductive features has a second average surface roughness that is less than the first average surface roughness.

18 Claims, 20 Drawing Sheets

SELECTIVELY ROUGHENED COPPER ARCHITECTURES FOR LOW INSERTION LOSS CONDUCTIVE FEATURES

BACKGROUND

High-performance integrated circuits (IC) devices demand high performance package metallization architectures to ensure high speed intra- or inter-chip data (e.g., I/O) transfer with a package. Data that is routed through package substrate metallization must travel at speeds close to or at chip clock frequencies with minimal distortion along high-speed I/O (HSIO) conductors embedded within the package substrate. The demand for higher performance signal conductors requires that package HSIO conductors have minimal insertion loss to ensure high-speed data transfer. At the same time, package substrate integrity must be maintained by ensuring strong adhesion between metal features and dielectric material within the substrate. Surface roughness of the metal conductors and other features plays a significant role in both design areas, however the effects of increased or decreased roughness has opposing consequences for both design goals. For example, increased surface roughness of the conductive features embedded within a package substrate increases adhesion to the dielectric material, but also increases insertion losses of the high-speed data conductors. The opposite is true for reduced surface roughness. A balance must be struck in the design of package metallization where both design goals are satisfied.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
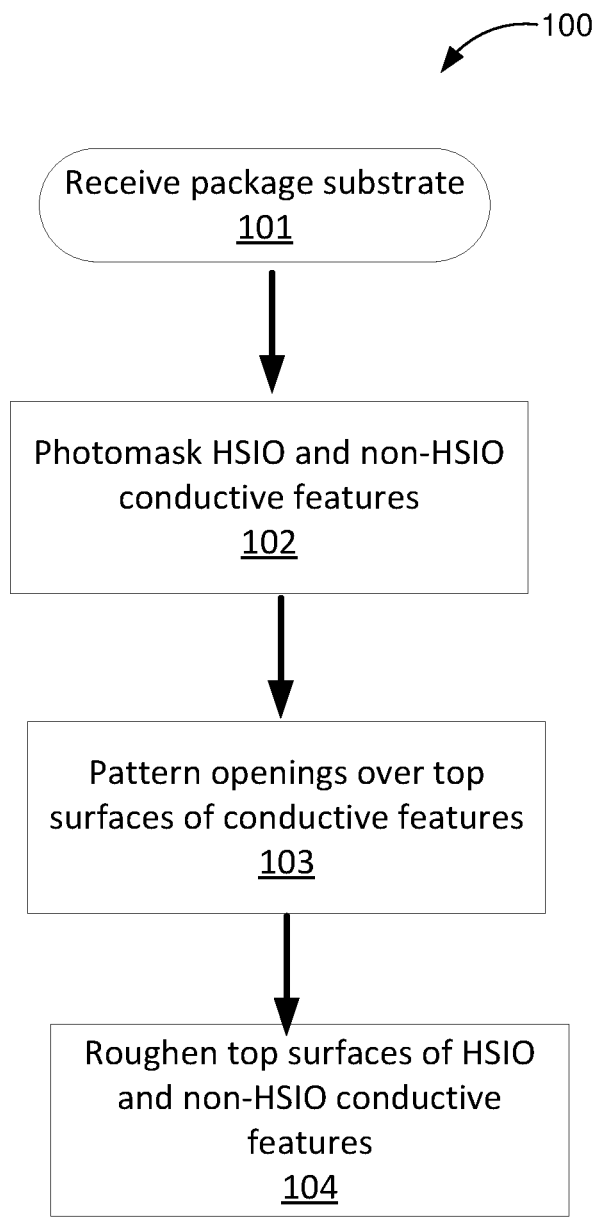
FIG. 1 illustrates a flow chart summarizing an exemplary method for making a package substrate comprising selectively roughened conductive feature top sides, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "conductive feature" may refer to any metal structure within a package substrate that is part of the extra-chip circuitry, and is generally embedded within the dielectric material of the package substrate. Structures include traces and pads that are within a metallization plane (e.g., in-plane). Vias that interconnect in-plane conductive features within adjacent metallization levels are included as well. "Conductive features" may be substituted by simply "features" at times within the disclosure.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is a package substrate for IC packages having selectively roughened in-plane conductive features within the substrate metallization, including HSIO traces and some pads, and non-HSIO structures such as via landing pads and non-HSIO traces. In this disclosure, HSIO features such as HSIO traces may be entirely dedicated to high-speed signal conduction, therefore requiring smooth surfaces to reduce losses that may compromise signal quality. In particular, HSIO traces having significant surface roughness may increase the insertion loss, possibly degrading the signal bandwidth of the HSIO signal routing. As a result, the overall signal speed of the device may be reduced to avoid distortion. Non-HSIO features may not carry HSIO signals, and may only conduct lower speed I/O signals or employed in power routing. In some embodiments, non-HSIO features may be part of the HSIO signal routing as through-layer vias and pads for vertical interconnection of HSIO traces.

The conductive features may have various degrees and combinations of surface roughness. For example, HSIO features such as HSIO traces may have a smooth (e.g., unroughened) surface on all sides, while non-HSIO features such as landing pads for vias are selectively roughened on all sides to reduce the risk of delamination of adjacent dielectric material from the metal surfaces of the landing pad. This architecture may be accomplished during package substrate fabrication by masking all sides (e.g., top surface and sidewalls) of the HSIO feature to shield them from chemical attack (e.g., a roughening etch), while leaving the surfaces of the non-HSIO feature exposed to roughening conditions in a particular process. In some embodiments, top surfaces of both HSIO and non-HSIO features are exposed, while sidewall surfaces of both HSIO and no-HSIO features are masked. The resulting roughened top surfaces of all conductive features may be a compromise architecture, as multiple HSIO traces may occupy a region of substrate where there are few or no vias, thus few or no roughened landing pads to anchor the dielectric. To compensate for the lack of anchoring structures in the region of substrate, the roughened top surfaces of the HSIO traces may increase the integrity of the substrate by increasing metal-dielectric adhesion in the region of substrate, and at the same time may cause a small but acceptable increase of insertion loss of these conductors.

In some embodiments, sufficient anchoring structures may be present within a region of substrate in the presence of HSIO features, thus negating the need for roughening of any HSIO feature surface. Only non-HSIO conductive features need have rough surfaces to anchor the adjacent dielectric material, therefore all surfaces of the HSIO features may be masked by a sacrificial material (e.g., a photoresist) to protect against chemical attack by the roughening etch. Conversely, the non-HSIO features may be selectively exposed to the chemical attack, allowing all surfaces to be roughened for best adhesion to surrounding dielectric material, increasing overall package reliability. By maintaining low surface roughness, the insertion losses of the HSIO features may be minimized.

In some embodiments, both HSIO and non-HSIO features may be simultaneously roughened initially, then HSIO features are selectively smoothed by laser annealing of the roughened surfaces. Partial melting of the feature may occur, causing a rounding and blending of the surfaces. The localized heating of the HSIO features may cause some ablation of the adjacent dielectric material in the vicinity of the HSIO features. An ablation damage zone surrounding the HSIO features may be present, with little or no effect on insertion loss.

In some embodiments, a permanent layer of a chemically resistant material may be formed over the HSIO features to protect the surfaces from roughening during processing, and remain after processing as a permanent part of the architecture. For example, a thin film of a material that is resistant to the roughening etch may be employed, such as a chemically resistant metal or non-metal such as silicon nitride. In some embodiments, a self-assembled monolayer comprising a perfluoroalkyl chain may be employed as the protective layer. The permanent layer may be engineered to advantageously reduce insertion losses by creating an optimized dielectric environment surrounding the HSIO feature, which may be defined by constants $D_f$ and $D_k$, where $D_f$ is defined as the loss tangent and $D_k$ is defined as the permittivity, (e.g., the dielectric constant) of a dielectric material.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates flow chart 100 summarizing an exemplary method for making a package substrate comprising selectively roughened conductive feature top sides, according to some embodiments of the disclosure.

At operation 101, a partial package substrate is received and prepared for fabrication of selectively roughened conductive features is employed, according to some embodiments. The as-received package substrate may comprise a top-level metallization plane on the surface of the substrate dielectric material that has been plated (e.g., by galvanic electroplating or by electroless deposition) in a previous operation. In some embodiments, the package substrate may be fabricated in a build-up process (e.g., a bumpless build-up layer [BBUL] package), whereby the package is formed by build-up of individual layers, each layer comprising a dielectric film and a metallization plane integral with the dielectric film. Metallization planes may comprise conductive features fabricated from electrodeposited copper (a semi-additive process) or etched (a subtractive process) through a lithographically defined photoresist mask. New layers may be added to a build-up package in cycles of dielectric film lamination and formation of a new metallization plane over the laminated dielectric film. In some embodiments, the package substrate may be fabricated by other methods, including formation of packages comprising organic and ceramic dielectric materials.

In addition to the top-level metallization plane, metallization planes embedded within the package dielectric material may be present. The number of buried metallization planes may depend on the number of build-up layers in the substrate. The metallization pattern of the top level and lower levels formed in earlier operations may include I/O (e.g., data) signal and/or power routing. In-plane conductive features for both power and I/O signals may comprise traces and pads.

In the disclosure, conductive features are divided into high-speed I/O (HSIO) conductive features and non-HSIO conductive features that do not conduct high-speed signals, therefore are not sensitive to surface roughness. In general, non-HSIO features are larger than HSIO features. Non-HSIO traces may not be as long as HSIO traces. Roughening non-HSIO features may not impact device performance. Rather, creating rough surfaces on non-HSIO features may enhance overall package reliability by increasing adhesion to the surrounding dielectric material. It is understood that all vias described in this disclosure, including vias associated with HSIO traces and pads, are non-HSIO features. HSIO conductive features may include I/O traces exhibiting a smooth surface finish. Non-HSIO conductive features may include structures having a greater surface roughness. Included in this category may be pads that are integral with vias, known as landing pads. Dielectric material adjacent to landing pads may have a propensity to delaminate if the average surface roughness Ra is too low. It is noted that throughout the disclosure, average surface roughness may also be referred to as the surface finish.

As-deposited (or as-etched) landing pads (and other conductive features) may have a Ra value that is too low to ensure adequate adhesion of adjacent dielectric material without increasing Ra. As an example, as-plated conductive features formed in a semi-additive electrodeposition process may exhibit an as-plated surface finish having a Ra of 100 nm or less. For values of average surface roughness that are less than 200 nm, there is a risk of delamination of adjacent dielectric material, degrading device reliability.

In some package substrate fabrication processes, all exposed conductive features within a metallization plane may be subjected to a non-selective roughening etch before adding new layers. In the non-selective etch, all exposed surfaces of HSIO and non-HSIO conductive features may be roughened indiscriminately. The increased surface roughness for all conductive features may advantageously increase dielectric-metal adhesion; however, HSIO trace performance may be degraded as insertion loss also correlates with increased surface roughness of those features.

The surface finish of conductive features may be characterized by an average surface roughness measurable by electron microscopy or profilometry. Surfaces of non-HSIO conductive features (e.g., buried landing pads and non-HSIO traces) may be characterized by an average surface roughness Ra (alternatively, Rq, the root mean square [RMS] surface roughness, may be employed as a metric of surface roughness) of 200 nm or higher for promotion of adhesion of the dielectric material to the copper. Throughout the disclosure, Ra may be the primary metric of surface roughness.

Ra (or Rq) of a metal (e.g., copper) surface may be increased by a wet or dry etch process employed to attack selected surfaces of non-HSIO conductive features. Surfaces subject to such attack may include top surfaces and sidewalls of traces and pads. Cross sections of electroplated conductive features may be substantially rectangular or trapezoidal, as conductive features may be plated into patterned openings in a photoresist plating mask or blanket-plated over the package dielectric and then patterned by a wet etch through a photoresist etch mask. After removal of the photoresist, three sides of the cross section, including the top surface and sidewalls, may be exposed. In this disclosure, mention is made of one-sided and three-sided attack. The number of sides exposed to chemical attack refers to number of exposed sides when viewing the cross section of the feature. For example, a three-sided attack on a trace or pad refers to the exposed (e.g., no mask) top surface and two sidewalls as viewed in a cross section of the feature. A one-sided attack refers to only the top surface or a sidewall surface being exposed.

The three exposed sides of the plated conductive features may be selectively roughened by masking sidewalls and/or top surfaces of selected features, then attacking exposed surfaces with an etch process optimized to increase Ra (Rq). For example, a three-sided or one-sided attack may be employed to selectively roughen all three sides of non-HSIO features, or only roughen the top surfaces of HSIO and non-HSIO features alike, protecting the smooth finish of the sidewalls of all conductive features within a metallization plane.

At operations 102 and 103, a photoresist mask may be coated or laminated (e.g., a dry film resist laminate) over top-level conductive features on the package substrate. The conductive features may include both HSIO and non-HSIO traces and pads. As selected roughening of only top surfaces of both HSIO and non-HSIO features is desired, openings may be patterned in the photoresist to expose the top surfaces only, leaving sidewalls covered by the photoresist. The remaining photoresist may protect the sidewalls against subsequent chemical attack.

At operation 104, the exposed top surfaces are subject to chemical attack to increase Ra. In some embodiments, a wet etchant, such as a weak copper etch solution, may be employed. In some embodiments, the Ra of the exposed top surfaces may be increased by gas phase methods, described below.

FIGS. 2A-2E illustrate operational cross-sectional views in the x-z plane of an exemplary method as outlined in FIG. 1 for fabricating package substrate 200 comprising selectively roughened conductive features, according to some embodiments of the disclosure.

Figure 2A:
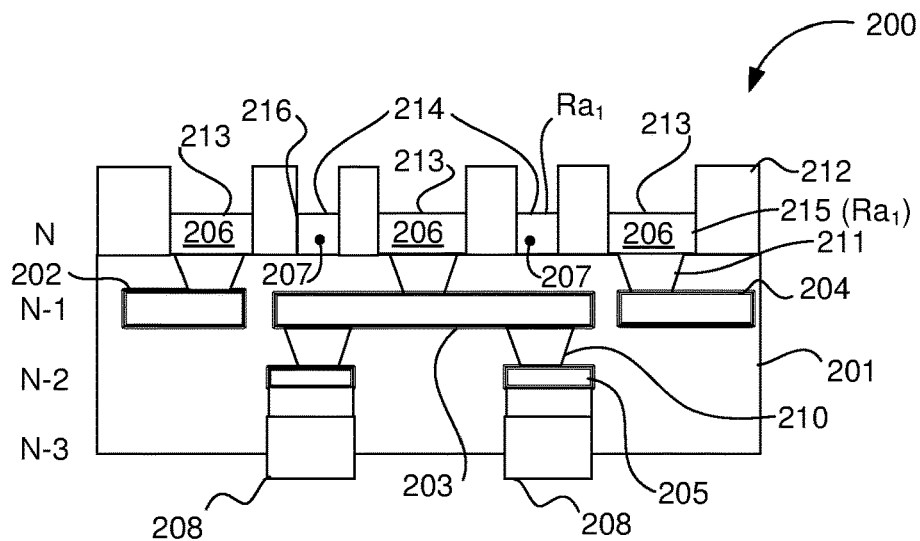
FIGS. 2A-2E illustrate operational cross-sectional views in the x-z plane of an exemplary method as outlined in FIG. 1 for fabricating a package substrate comprising selectively roughened conductive features, according to some embodiments of the disclosure.

Referring to FIG. 2A, package substrate 200 a received into a selective roughening process. Package substrate 200 is shown covered by a patterned photoresist mask (e.g., mask 212, described below) to protect sidewalls of all pads in the top metallization plane. Photoresist mask 212 may be applied as a first step in the roughening operation. In some embodiments, the as-received package substrate comprises at least one layer of a dielectric material having an associated metallization plane formed over the dielectric layer. In substrates having multiple layers, multiple metallization planes may be embedded within the dielectric material, with a top metallization plane (level N) on the top surface of the as-received package substrate. In the illustrated embodiment, package substrate 200 comprises lower metallization planes N-1 and N-2 (comprising landing pads 202, 203, 204, and landing pads 205 respectively) embedded within dielectric 201. Landing pads 202-205 may be integral with in-plane traces extending from them, but not shown in the figure.

Metallization planes N and N-3 are top and bottom level metallization planes on top and bottom surfaces of dielectric 201, respectively. Top-level plane N comprises non-HSIO traces 206 and HSIO traces 207, whereas bottom-level plane N-3 comprises land interconnects 208. Metallization levels N through N-3 are part of a multilevel stack of conductor planes on and within package substrate 200, which may include more conductor planes below level N-3 (e.g., N-4, N-5, etc. with increasing depth, not shown). Top-level metallization plane N and metallization planes below level N may have been formed in previous electroplating operations. Between metallization levels N through N-3, vias 210 and 211 provide vertical interconnects (e.g., between metallization levels N-2 and N-1, and N-1 and N, respectively). In some embodiments, conductive features (e.g., traces 202 through 208, vias 210 and 211) comprise copper or an alloy of copper. In other embodiments, conductive features comprise aluminum, gold, nickel, cobalt, silver, platinum, palladium, copper or silicon.

Package substrate 200 may be formed by a cored or coreless build-up layer process, as mentioned above, whereby dielectric material is deposited or laminated one layer at a time. The dielectric material may include an organic film laminates or liquid resins (including ceramic composites) that may be molded into individual layers. An electroplated metallization plane may be formed over each dielectric layer, after which a new dielectric layer is added over the metallization plane. The dielectric layer thickness may range between 10 and 100 microns. The metallization plane may comprise copper having a thickness ranging between 5 and 40 microns may be formed by semi-additive electrodeposition (e.g., of copper).

In some embodiments, dielectric 201 is a single layer of dielectric (e.g., a dielectric laminate or a molded resin) having a thickness between 10 and 100 microns. In some embodiments, dielectric 201 is part of multilayer package stack comprising multiple dielectric layers, where only the top portion of the package is shown in the figure. In some embodiments, dielectric 201 may comprise multiple layers of an organic laminate, each laminate layer having thicknesses ranging between 10 and 100 microns. While dielectric layer boundaries may coincide with conductor levels, multiple layers of dielectric may be between conductor planes. In some embodiments, dielectric 201 comprises a molded resin (e.g., an epoxy) or ceramic composite.

Conductive features (e.g., traces 206 and 207) may be formed by semi-additive electroplating copper over dielectric 201 to thicknesses up to 40 microns. Semi-additive electroplating processes may include plating through a lithographically-defined openings in a photoresist mask. In the illustrated example, non-HSIO traces 206 are interconnected to embedded landing pads 202 and 204 and may also be interconnected to other traces (not shown) within metallization plane N-1. Non-HSIO traces 206 may be power routing traces, for example. In multilevel package substrates, HSIO traces 207 may also be vertically interconnected to higher or lower conductor planes and to high-speed circuitry in an attached IC chip such as a microprocessor by small diameter vias (see FIG. 13B).

In FIGS. 2A-2E (and all subsequent figures in the disclosure), embedded landing pads 202-205 are represented by compound outlines to indicate high surface roughness. It may be understood that these non-HSIO features have been similarly roughened in previous operations.

In the illustrated embodiment, photoresist mask 212 has been deposited and patterned over traces 206 and 207 in previous operations, exposing top surfaces 213 and 214 of non-HSIO traces 206 and HSIO traces 207, respectively. photoresist mask 212 remains between non-HSIO traces 206 and HSIO traces 207, covering sidewalls 215 and 216 respectively.

Figure 2B:
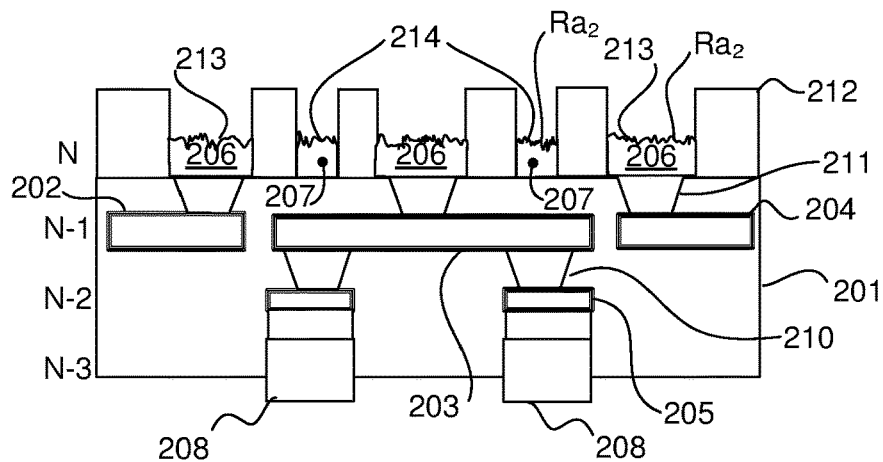

Referring to FIG. 2B, exposed top surfaces 213 and 214 of traces 206 and 207, respectively, are roughened to an average surface roughness $Ra_2 > 200$ nm $> Ra_1$ nm by chemical attack (e.g., a roughening etch). In some embodiments, a wet etchant, such as a weak copper etch solution, may be employed. The slow chemical attack may result in controlled pitting and localized dissolution of the exposed top surfaces. Pitting and localized dissolution may occur at surface sites having defects such as microscopic cracks, grain boundaries and dislocations. A resulting surface roughness may ensue, controlled by etch conditions. In some embodiments, the average surface roughness of the exposed top surfaces may be increased by inert gas sputtering bombardment. In some embodiments, a dry plasma etch method may be employed, whereby a gas phase chemical attack may be enhanced by plasma bombardment and volatilization of dislodged metal atoms. The degree of roughness may be controlled by the nature of the chemical attack, and conditions such as etchant concentration, temperature and exposure time. Different wet and dry chemistries may be employed to achieve desired surface finish (e.g., $Ra_2$) of the conductive features.

While insertion loss of the HSIO traces 207 may be increased somewhat by the roughening of the top surfaces 214 relative to their pre-roughening state, a compromise may be realized by increased area adhesion of dielectric layer 217 supported by roughened top surfaces 214. For example, HSIO traces may be concentrated in a substrate region substantially devoid of vias and landing pads. Overall substrate integrity may be enhanced by including roughened top surfaces of HSIO traces in the substrate region where landing pads are scarce.

Figure 2C:
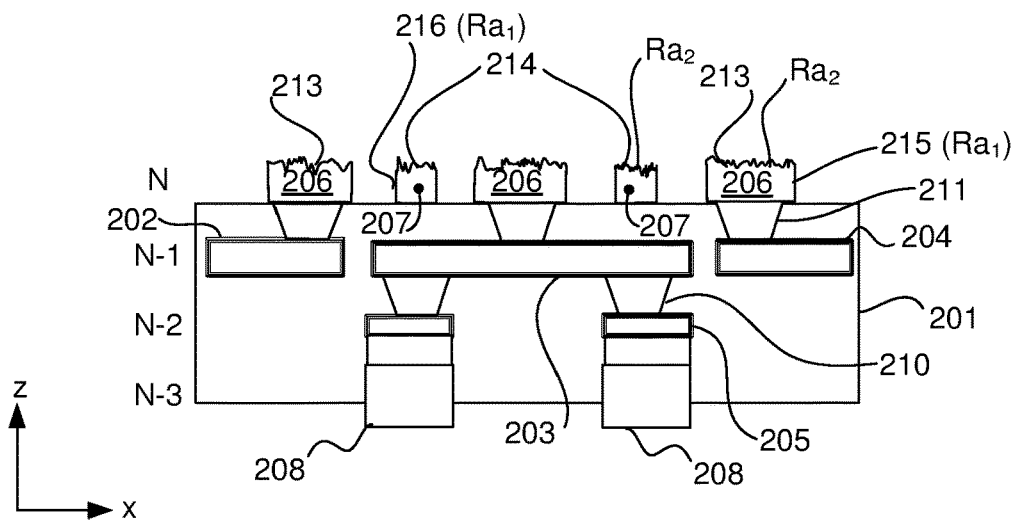
Figure 2D:
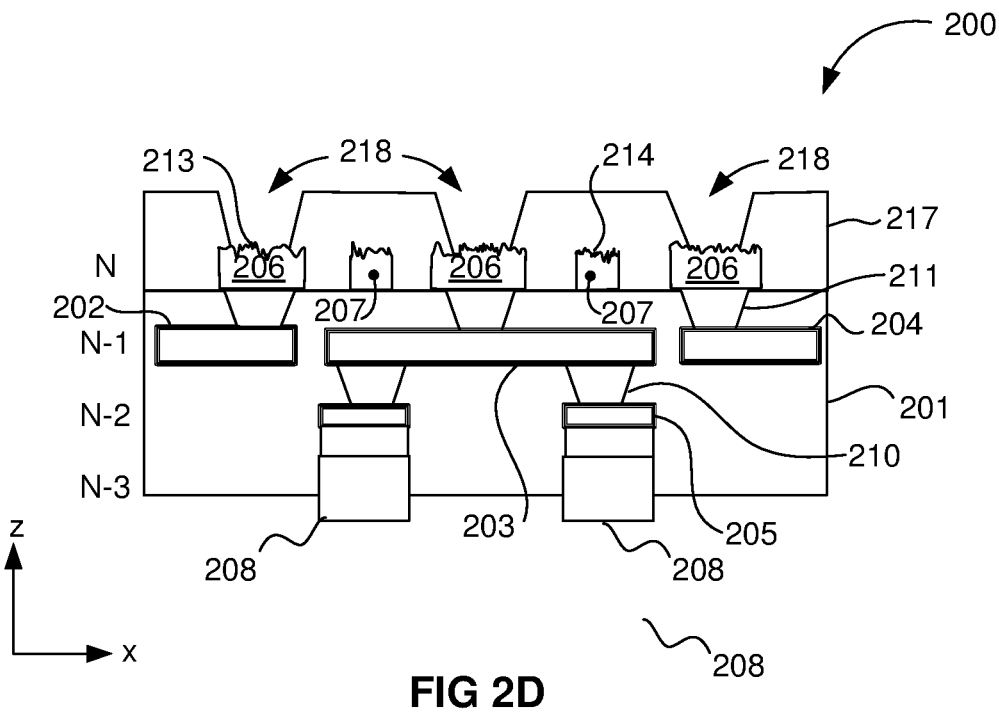

Referring to FIG. 2C, photoresist (e.g., 212) is removed after a desired surface roughness $Ra_2$ has been achieved. As sidewalls 215 and 216 were shielded from chemical attack by photoresist 212, they retain an initial average surface roughness $Ra_1$. In subsequent operations, a layer of dielectric may be laminated over traces 206 and 207. The roughened top surfaces 213 and 214 of traces 206 and 207, respectively, may promote adhesion of the dielectric. Top surfaces 214 of HSIO traces 207 have a larger surface roughness $Ra_2$ relative to sidewalls 216 (e.g., $Ra_1<Ra_2$). In some embodiments, $Ra_2$ is at least $1.5Ra_1$. The increased surface roughness of top surfaces 213 and 214 may promote adhesion of subsequent layers of dielectric Referring to FIG. 2D, dielectric layer 217 is added to package substrate 200. Dielectric layer 217 may be a film laminate as described above. Openings 218 are formed in dielectric layer 217 over traces 206. In some embodiments, traces 206 are to be landing pads for vias grown in openings 218 by electrodeposition. Openings 218 may be formed by laser drilling, as an exemplary method, or optionally by a suitable etch process such as a deep reactive ion etch (DRIE) or a suitable wet etch exposing portions of top surfaces 213 of traces 206 for via formation by electrodeposition methods described below. Etch processes may require additional lithographic steps, whereas laser drilling may be performed as a direct write process.

Figure 2E:
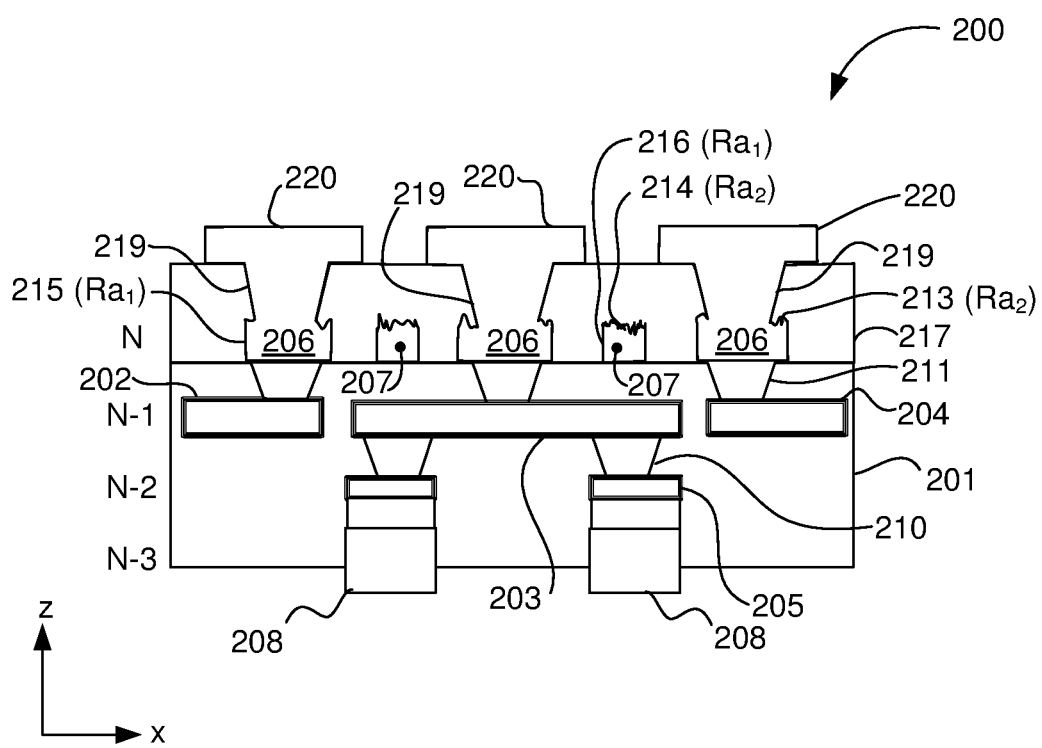

Referring to FIG. 2E, vias 219 and associated pads 220 are plated into openings 218 and over adjacent dielectric, respectively. Pads 220 may be top-level die interconnect pads or landing pads for vias grown over pads 220 in subsequent operations. Vias 219 are grown on traces 206, which may be integral with non-HSIO traces (not shown) that may interconnect traces 206 to a power source (e.g., a potentiostat) for electroplating. Vias 219 may alternatively be grown by electroless deposition of copper, for example, in openings 218, with exposed top surfaces 213 of traces 206 serving as growth substrates.

For purposes of power conveyance between conductor planes, multiple adjacent via sets (not shown) may be combined in parallel. For example, vias may be electrically coupled in parallel by electroplating two or more vias together on traces 206 and integrally formed with pads 220.

Traces 206 (serving as landing pads), extend laterally beyond bases of vias 219, leaving a peripheral region of roughened top surfaces 213 to interface with bulk dielectric material in dielectric layer 217. The roughened periphery of top surfaces 213 (e.g., having an average surface roughness $Ra_2>200$ nm) may increase adhesion strength between traces 206 and the bulk dielectric material. Similarly, top surfaces 214 of HSIO traces 207 have an average surface roughness $Ra_2$ in the illustrated embodiment, and may further strengthen adhesion bonding of dielectric layer 217 in the regions adjacent to traces 206.

Figure 3:
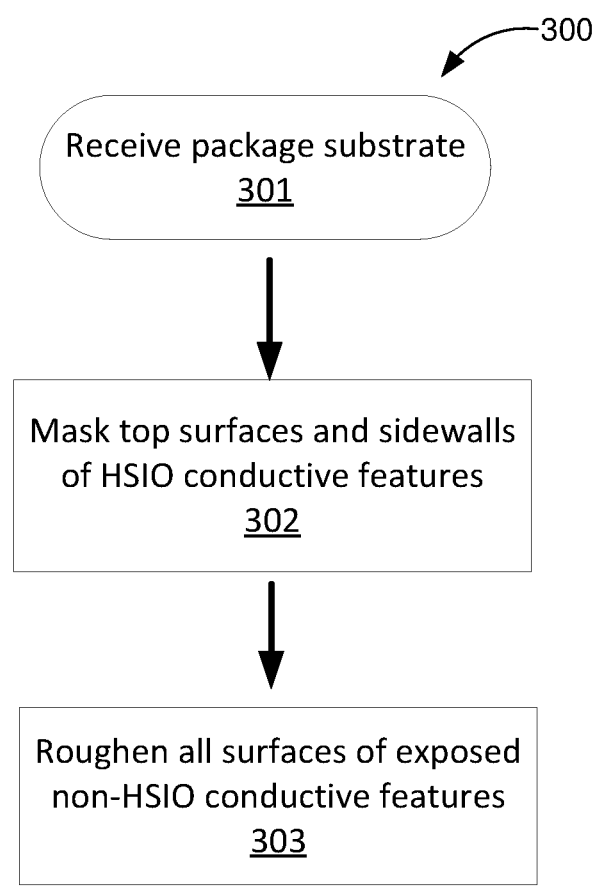
FIG. 3 illustrates a flow chart summarizing an exemplary method for making a package substrate comprising selectively roughened top sides and sidewalls of non-HSIO conductive features, while maintaining smooth surface finish of HSIO conductive features, according to some embodiments of the disclosure.

FIG. 3 illustrates flow chart 300 summarizing an exemplary method for making a package substrate comprising selectively roughened top sides and sidewalls of non-HSIO conductive features, while maintaining smooth surface finish of all surfaces of HSIO conductive features, according to some embodiments of the disclosure.

At operation 301, a partial package substrate similar to package substrate of operation 101 and described above is received in-process for fabrication of three-sided roughening of selected non-HSIO conductive features, while selected HSIO conductive features (e.g., HSIO traces) are masked to protect the three open surfaces against chemical attack, according to some embodiments. The description of the partial package substrate in operation 301 is substantially the same as that given above in the description of operation 101. The as-received partial package substrate comprises a top-level metallization plane comprising HSIO and non-HSIO conductive features that may exhibit a smooth surface finish (e.g., having an average surface roughness $Ra_1<200$ nm). These top-level conductive features are subject to the subsequent process operations.

At operation 302, all sides (e.g., top sides and sidewalls) of selected top-level HSIO traces may be masked by a patterned photoresist. A suitable photoresist material may be coated as a liquid, or laminated as a dry film resist, over the top surface of the as-received package substrate, blanketing all conductive structures. The applied photoresist may be lithographically patterned to remain over the selected HSIO traces after resist development. Non-HSIO conductive features may be exposed. Optionally, a hard mask (e.g., a resistant metal or silicon nitride thin film) may be deposited over the as-received package substrate and patterned to expose non-HSIO conductive features only, leaving the HSIO traces covered.

At operation 303, prior to the roughening process, all surfaces of both the HSIO and non-HSIO conductive features may exhibit a smooth finish, characterized by $Ra_1<200$ nm. The exposed non-HSIO conductive features are subject to a three-sided roughening etch, resulting in increasing the average surface roughness of top surfaces and sidewalls of the non-HSIO conductive features to $Ra_2>200$ nm. Suitable surface roughening processes have been described above.

The patterned photoresist or hard mask may be removed by a suitable stripping process, exposing the as-formed top surface and sidewalls of the HSIO traces, having the original average surface roughness $Ra_1<200$ nm.

After operation 303 is complete, the partial package substrate may undergo further processing cycles to complete the substrate architecture. As an example, a layer of dielectric material may be added over the top metallization plane. Openings may be formed in the dielectric layer over non-HSIO pads, within which vias may be plated. A metallization plane comprising HSIO and non-HSIO conductive features may be formed over the surface of the dielectric layer, interconnected to the lower metallization level (e.g., the top metallization level in operation 301) by the plated vias. The conductive features of the subsequent metallization plane may be subject to a roughening process similar to the processes described above. New metallization planes may be added to the partially complete build-up package substrate by repeating the process cycle until the package substrate is complete.

FIGS. 4A-4E illustrate operational cross-sectional views in the x-z plane of an exemplary method as outlined in FIG. 3 for fabricating package substrate 400 comprising selectively roughened non-HSIO conductive features, according to some embodiments of the disclosure.

Figure 4A:
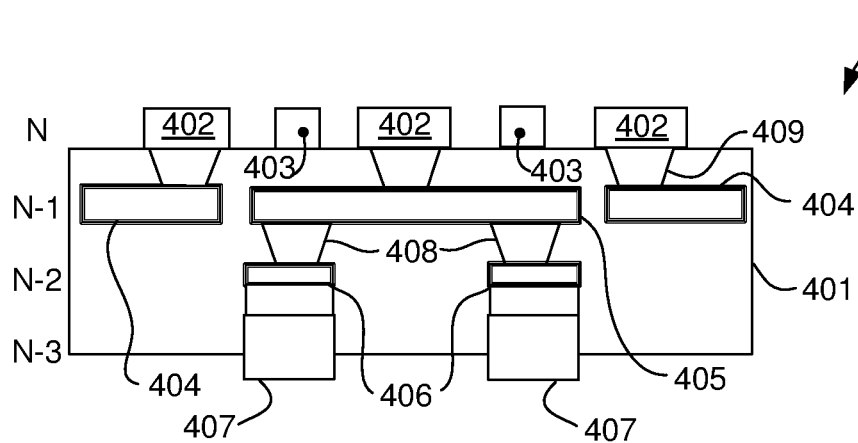
FIGS. 4A-4E illustrate operational cross-sectional views in the x-z plane of an exemplary method as outlined in FIG. 3 for fabricating a package substrate comprising selectively roughened non-HSIO conductive features, according to some embodiments of the disclosure.

In FIG. 4A, package substrate 400 is shown at an intermediate stage of build-up fabrication. Package substrate 400 comprises top-level (e.g., level N) conductive features 402 and 403. Conductive features 402 may be non-HSIO pads, where conductive features 403 may be HSIO traces. In the illustrated embodiment, package substrate comprises buried conductive features such as landing pads 404, 405 and 406 in adjacent conductor planes (in descending order) N−1, N−2 and N−3, respectively, embedded within dielectric 401. As mentioned above, these landing pads may have been roughened in previous build-up cycles, and are represented in the illustrated embodiment by rectangles having compound (thick) outlines, indicating a surface roughness that is larger than the as-plated value. Additional conductor planes may be present below level N−3 (e.g., N−4, N−5, etc.). Pads 407 are landside interconnects for bonding package substrate 400 to a printed circuit board (not shown). Conductive features 402-406 may be pads, for example, having thicknesses ranging between 10 and 50 microns. In some embodiments, pads 404 and 405 are landing pads for vias 408 and 409, interconnecting metallization levels N, N−1 and N−2. In some embodiments, conductive features 402-408 comprise copper or an alloy of copper.

In some embodiments, package substrate 400 comprises a core (not shown). In some embodiments, power planes on opposite sides of the package core may be interconnected by through-vias and/or copper plug inserts extending through the core (not shown).

Figure 4B:
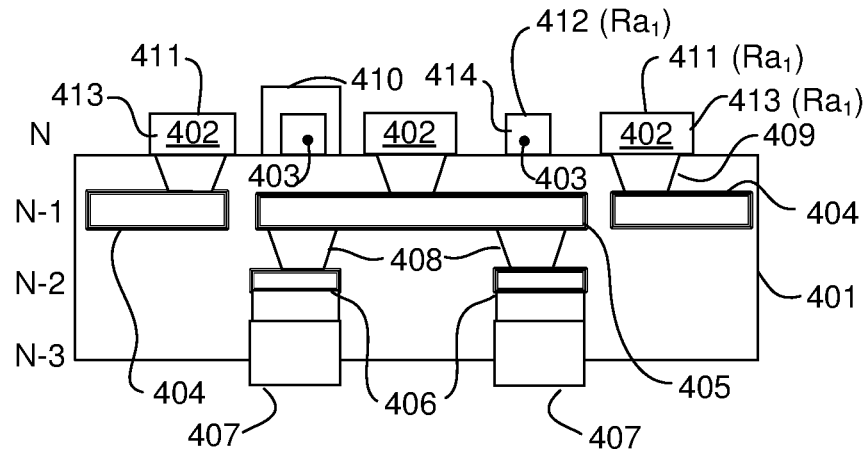
Figure 4C:
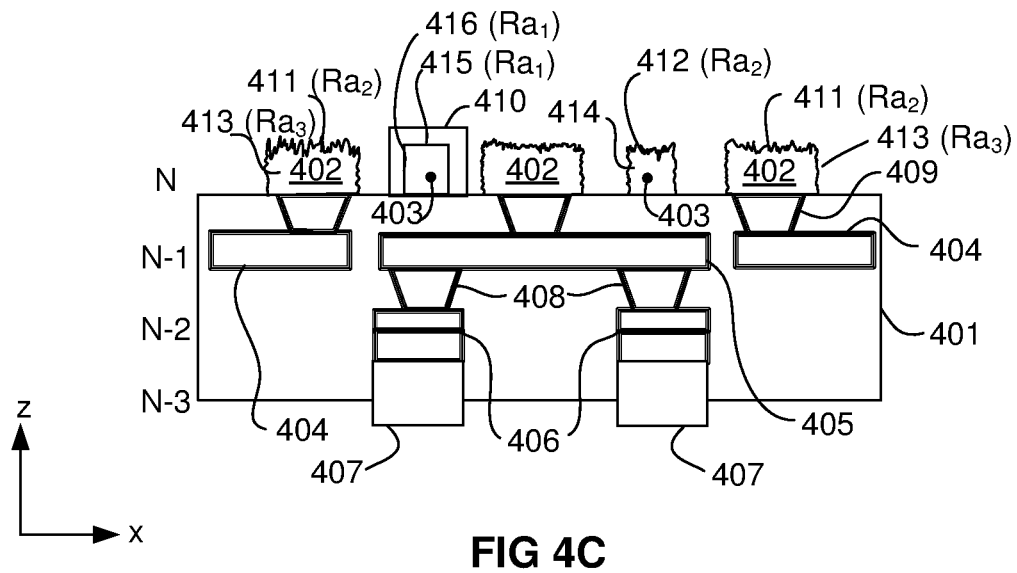

Referring to FIG. 4B, a photoresist mask or hard photomask 410 is formed over conductive features 402 and 403 and patterned to cover one or both HSIO traces 403 (only one shown in the illustrated embodiment). While in the illustrated example shows a portion of HSIO traces 403 are selectively protected, in some embodiments all HSIO traces 403 and other features are protected by photomask 410. Openings in photomask 410 are made over non-HSIO conductive features such as pads 402 and non-HSIO traces (e.g., some of traces 403) to expose top surfaces 411, 412 and sidewalls 413 and 414 to a subsequent roughening operation, Referring to FIG. 4C, top surfaces 411 and sidewalls 413 of non-HSIO conductive features 402 are exposed to chemical attack (e.g., etch) to undergo selective roughening, increasing average surface roughness from $Ra_1$ of the as-plated conductive features to $Ra_2$ on top surfaces 411 and 412, and to an average surface roughness $Ra_3$ on sidewalls 413 and 414. In some embodiments, $Ra_2$ and $Ra_3 > 200$ nm$>Ra_1$. In some embodiments, $Ra_2$ and $Ra_3$ are substantially the same. In some embodiments, $Ra_2 > Ra_3$.

Top surface 405 and sidewalls 416 of protected HSIO trace 403a are shielded from chemical attack by photomask 410, retaining their original surface finish having average surface roughness $Ra_1$.

Figure 4D:
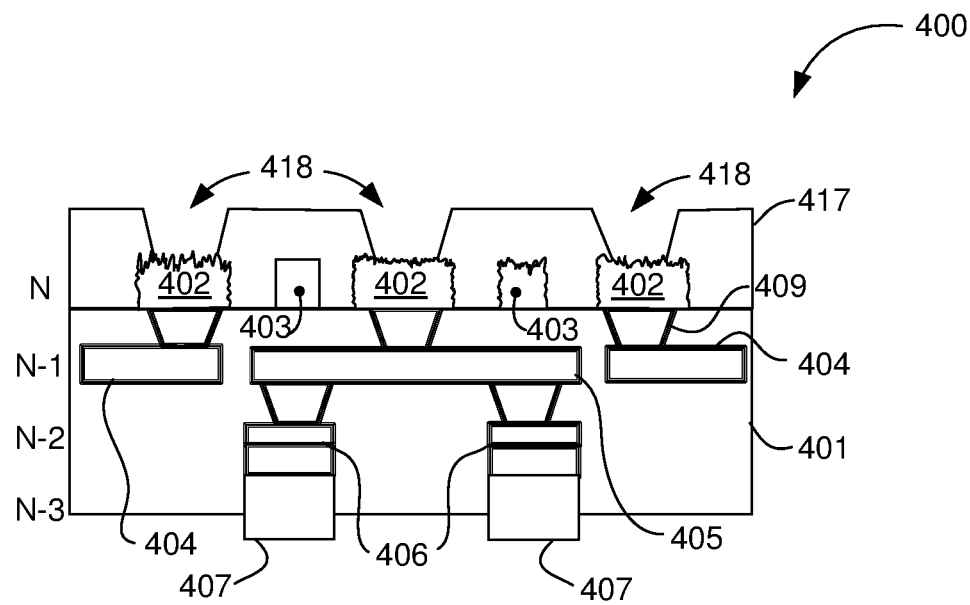

Referring to FIG. 4D, dielectric layer 417 is laminated over conductive features 402 and 403, over which via openings 418 may be formed by laser drilling. Conductive features 402 may be landing pads for vias to be plated in via openings 418.

Figure 4E:
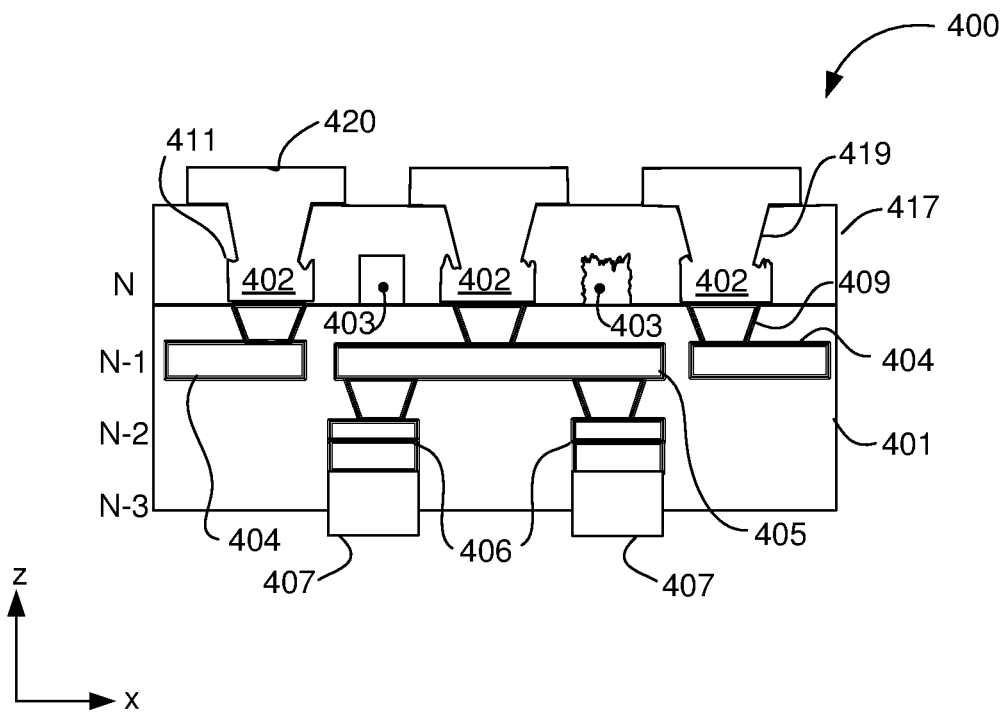

Referring to FIG. 4E, vias 419 are grown in openings 418 by electroplating copper or a suitable alloy of copper. In some embodiments, vias 419 are formed by electroless deposition of copper or a suitable copper alloy. Pads 420 are formed over the surface of dielectric layer 417 adjacent to vias 419. Pads 402 are landing pads extending laterally beyond bases of vias 419. As described above, a peripheral region of roughened top surfaces 213 may form an interface with bulk dielectric material in dielectric layer 417. The roughened periphery of top surfaces 411 (e.g., having average surface roughness $Ra_2 > 200$ nm) may increase adhesion strength and reliability between pad 402 and the bulk dielectric material in dielectric layer 417. Similarly, top surfaces 412 of HSIO traces 403 have an average surface roughness $Ra_2$ in the illustrated embodiment, and may further strengthen adhesion bonding of dielectric layer 417 in the regions adjacent to pads 403.

Figure 5:
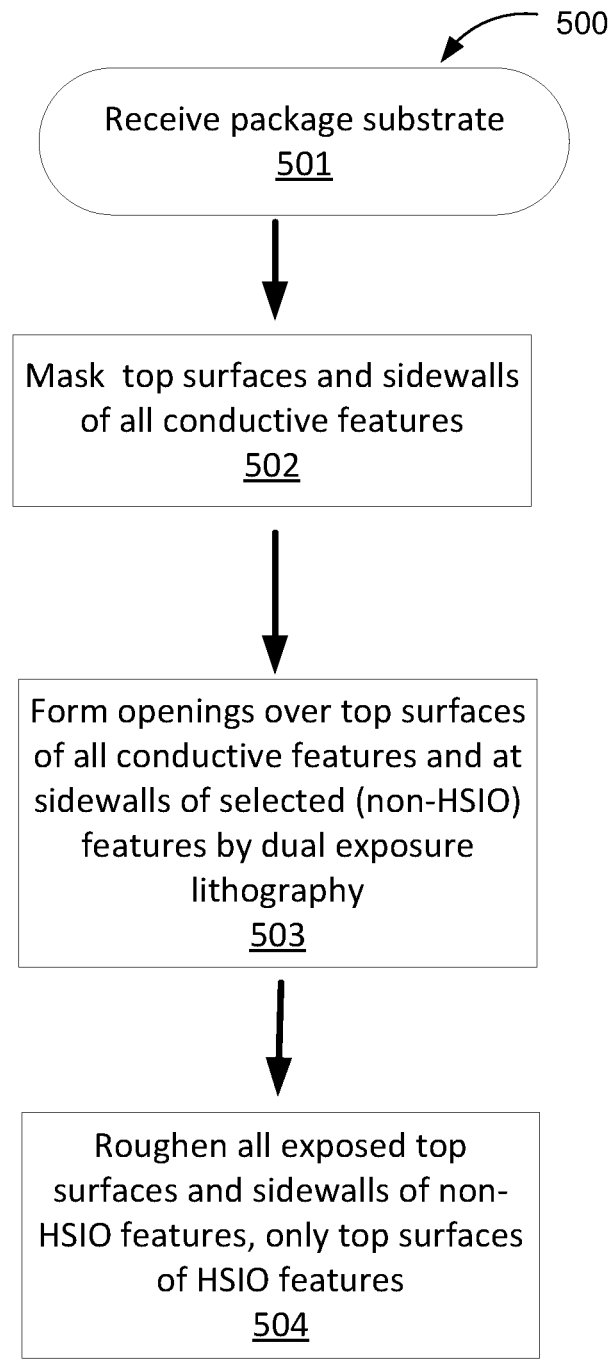
FIG. 5 illustrates a flow chart summarizing an exemplary method for making a package substrate comprising selectively roughened top surface and sidewalls of non-HSIO conductive features, as well as top surfaces of HSIO conductive features, while maintaining smooth surface finish of HSIO conductive feature sidewalls, according to some embodiments of the disclosure.

FIG. 5 illustrates flow chart 500 summarizing an exemplary method for making a package substrate comprising selectively roughened top surface and sidewalls of non-HSIO conductive features, as well as top surfaces of HSIO conductive features, while maintaining smooth surface finish of HSIO conductive feature sidewalls, according to some embodiments of the disclosure.

At operation 501, a partial package substrate similar to package substrate of operation 101 and described above is received in-process for fabrication selective three-sided and one-sided roughening of both HSIO and non-HSIO conductive features, according to some embodiments. The description of the partial package substrate is substantially the same as that given above in the description of operation 101. The as-received partially complete package substrate comprises a top-level (e.g., surface) metallization plane comprising HSIO and non-HSIO conductive features that may exhibit a smooth surface finish (e.g., having an average surface roughness $Ra_1 < 200$ nm). These top-level conductive features are subject to the subsequent process operations.

At operation 502, a photomask may be laminated or coated over the top layer, covering all surfaces (e.g., top surfaces and sidewalls) of all top-level conductive features. The photomask may be a photoresist (e.g., a dry film resist) or a hard mask (e.g., a chromium or silicon nitride thin film).

At operation 503, a dual-exposure lithography operation may be employed to first make primary openings in the photomask over the top surfaces of all top-level conductive features, and subsequently form secondary openings over sidewalls of selected conductive features. In some embodiments, both top surfaces and sidewalls of non-HSIO conductive features may be exposed simultaneously in a single-exposure lithography operation by forming expanded openings over selected conductive features, exposing sidewalls in addition to top surfaces of selected non-HSIO features.

At operation 504, the selected surfaces, including the top surface and sidewalls of the selected non-HSIO features (e.g., pads and non-HSIO traces) and top surfaces only of the selected HSIO features (e.g., HSIO traces) are roughened by chemical attack (e.g., a mild wet etch). As described above, the process conditions may be adjusted to create a surface finish having an average surface roughness $Ra_2 > 200$ nm. As mentioned above, the as-plated conductive features may have an initial average surface roughness of 150 nm or less. Selected non-HSIO features may be roughened on all surfaces (top surface and sidewalls) while selected HSIO features may be roughened only on the top surface, as the sidewalls of the HSIO features are masked during the chemical treatment. HSIO features (e.g., HSIO traces), may be roughened only the top surface, whereas non-HSIO features (e.g., landing pads), are subject to chemical treatment of all three sides (top surface and sidewalls) to maximize dielectric adhesion, as described above. An exemplary process flow according to the above summary is illustrated below.

FIGS. 6A-6E illustrate operational cross-sectional views in the x-z plane of an exemplary method as outlined in FIG. 5 for fabricating package substrate 600 comprising selectively roughened HSIO and non-HSIO conductive features, according to some embodiments of the disclosure.

Figure 6A:
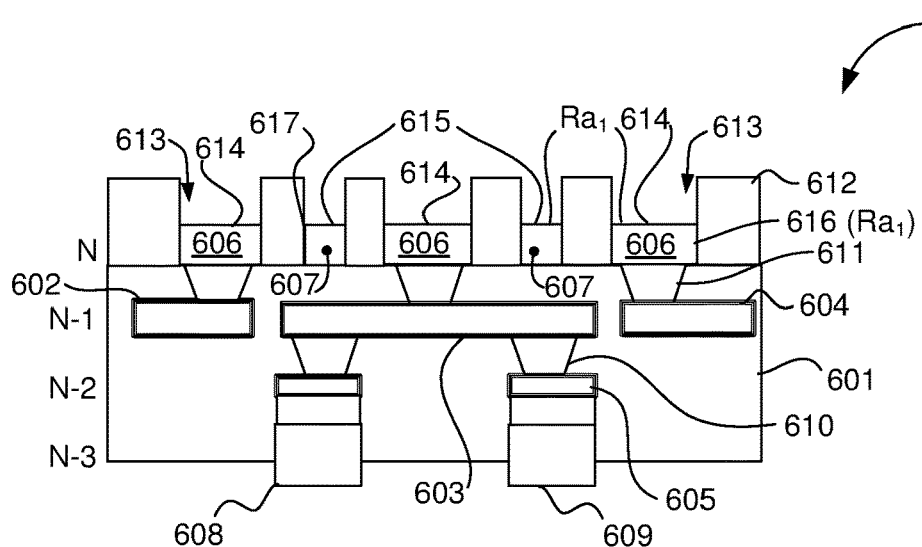
FIGS. 6A-6E illustrate operational cross-sectional views in the x-z plane of an exemplary method as outlined in FIG. 5 for fabricating a package substrate comprising selectively roughened HSIO and non-HSIO conductive features, according to some embodiments of the disclosure.

In FIG. 6A, package substrate 600 is shown at an intermediate stage of fabrication, comprising top-level (e.g., level N) metallization features 606 and 607 and patterned photomask 612 to protect conductive feature sidewalls, as described below. In the illustrated embodiment, conductive features 606 are non-HSIO pads, whereas conductive features 607 are HSIO traces. In the illustrated embodiment, package substrate comprises buried conductive features such as pads 602, 603, 604 and 605 in adjacent conductor planes (in descending order) N−1, N−2 and N−3, respectively, embedded within dielectric 601. Additional conductor planes may be present below level N−3 (e.g., N−4, N−5, etc.). Pads 608 and 609 are landside interconnects for bonding package substrate 600 to a printed circuit board (not shown). In some embodiments, pads 602-604 and 605 are landing pads for vias 610 and 611, interconnecting metallization levels N, N−1 and N−2. Land interconnects 608 and 609 are within bottom metallization level N−3. Interconnects (e.g., lands) 608 and 609 may be integral with buried landing pads 605 or connected thereto by vias (not shown) In some embodiments, all conductive features 602-611 comprise copper or an alloy of copper.

In the illustrated embodiment, photomask 612 has been deposited over non-HSIO features 606 and HSIO features 607 at top metallization level N in a previous operation. As described above, photomask 612 may comprise a photoresist layer (e.g., a dry film resist) or a hard mask (e.g., a chrome or nickel thin film, or a silicon nitride thin film). Patterned openings 613 expose top surfaces 614 and 615, respectively. In the illustrated embodiment, photomask 612 is a patterned photoresist, covering sidewalls 616 and 617, respectively for non-HSIO features 606 and HSIO features 607. As indicated in the figure, top surfaces 614 and 615, as well as sidewalls 616 and 617, exhibit an initial (as-plated) surface finish having an average roughness $Ra_1 < 150$ nm prior to roughening.

Figure 6B:
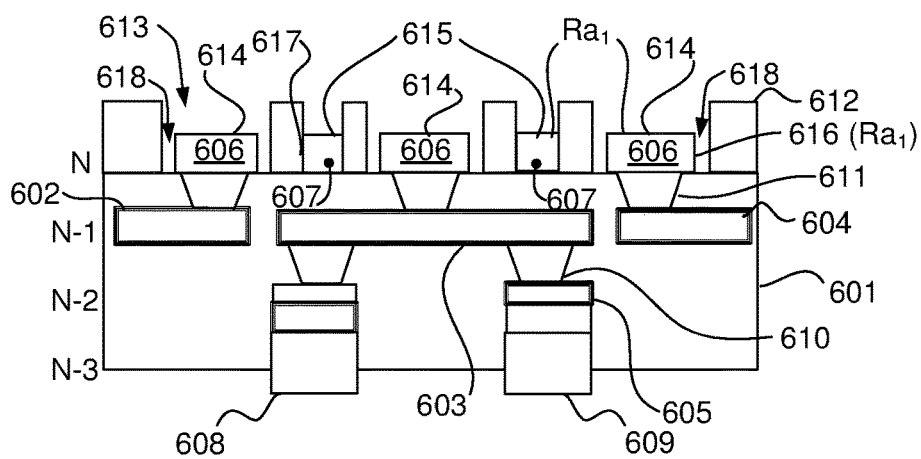

In FIG. 6B, secondary openings 618 are formed adjacent to sidewalls 616 in a dual exposure lithographic step. Secondary openings 618 may extend initial (primary) openings 613 laterally to expose sidewalls 616 of non-HSIO conductive features 606, exclusive of HSIO conductive features 607. A single exposure lithographic operation may be optionally employed, whereby secondary openings 618 are formed simultaneously with primary openings 613. In some embodiments, secondary openings 618 may be formed adjacent to sidewalls 617 of selected HSIO conductive features 607, either exclusively or in addition to sidewalls 616 of selected non-HSIO conductive features 606.

Accordingly, selected HSIO conductive features 607 (e.g., HSIO traces) have only top surfaces 615 exposed for subsequent roughening. Selected HSIO conductive features 607 may comprise all or a subset of HSIO conductive features 607 within metallization level N. Following the formation of secondary openings 618, selected non-HSIO conductive features 606 (e.g., pads) are exposed on three sides (referring to the cross-sectional view of the figure), including top surfaces 614 and sidewalls 616. Non-HSIO conductive features 606 may be landing pads prone to delamination of dielectric if they possess a smooth surface finish, for example, a surface finish having the as-plated average surface roughness $Ra_1 < 150$ nm. Increasing surface roughness of landing pads may increase adhesion strength between the pads and the adjacent dielectric, reducing chances of delamination.

Figure 6C:
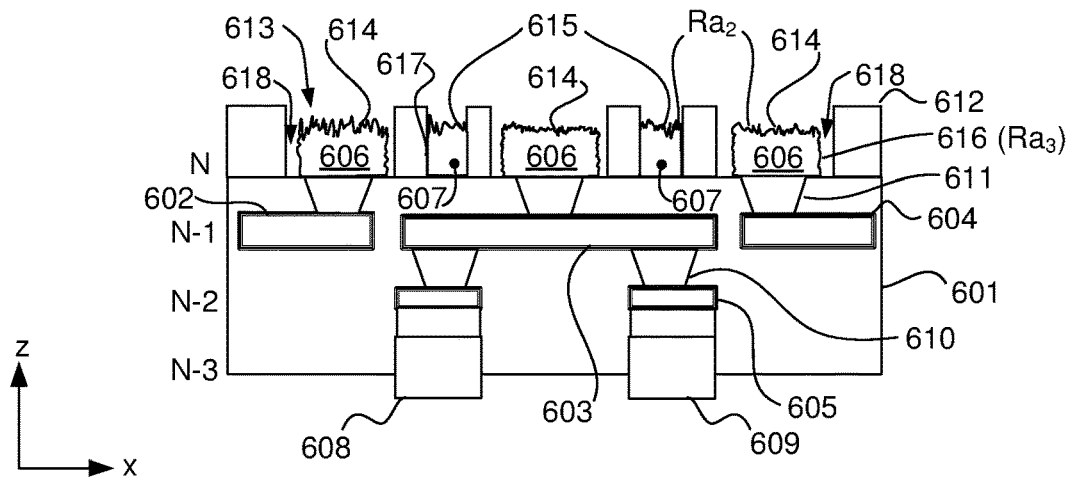

Referring to FIG. 6C, top surfaces 614 and sidewalls 616 of non-HSIO conductive features 606 are exposed to chemical attack (e.g., etch) to undergo selective roughening. In some embodiments, the chemical treatment results in a roughened surface finish on non-HSIO conductive features 606 and HSIO conductive features 607. For example, top surfaces 614 and 615 may have an average surface roughness of $Ra_2$. Sidewalls 616 of non-HSIO conductive features 606 may have an average surface roughness $Ra_3$. In some embodiments, $Ra_3$ is substantially the same as $Ra_2$, where $Ra_2$ and $Ra_3$ are both greater than 200 nm (e.g., $Ra_2$ and $Ra_3 > Ra_1$). In some embodiments, $Ra_1 > 1.5 Ra_2 > Ra_3$.

Sidewalls 617 of HSIO conductive features 607 are shielded from chemical attack by photomask 612, retaining their original surface finish having average surface roughness $Ra_1$. As an example, HSIO conductive features 607 may be HSIO traces. Selective surface roughening of conductive features is achieved by the dual exposure pattern of photomask 612, as depicted in FIG. 6C, whereby sidewalls of the target conductive features may be exposed in a selective manner. Sidewalls 617 are selectively protected by photomask 612, conserving the as-plated surface finish (e.g., $Ra_1$) of the HSIO sidewalls. Roughening of only top surfaces 615 of HSIO conductive features 607 while maintaining smooth sidewalls ensures low insertion loss of these structures for high-speed signal propagation. The selective roughening of the HSIO conductive features afforded by the selective masking of HSIO sidewalls while leaving top surfaces exposed may improve device performance and reliability relative to non-selective roughening of all conductive features, where insertion loss may be increased to an unacceptable level in the HSIO conductive features if all sides are roughened. As an example, limiting roughening only to a single surface of the HSIO traces while maintaining smooth sidewalls may not significantly increase the insertion loss of the structures. Lower insertion loss may enable higher-speed signal propagation along these traces than along traces that have high surface roughness on all three surfaces. The increased top surface roughness may add to mechanical adhesion of surrounding dielectric to the adjacent or nearby non-HSIO features such as landing pads (e.g., non-HSIO conductive features 606).

Figure 6D:
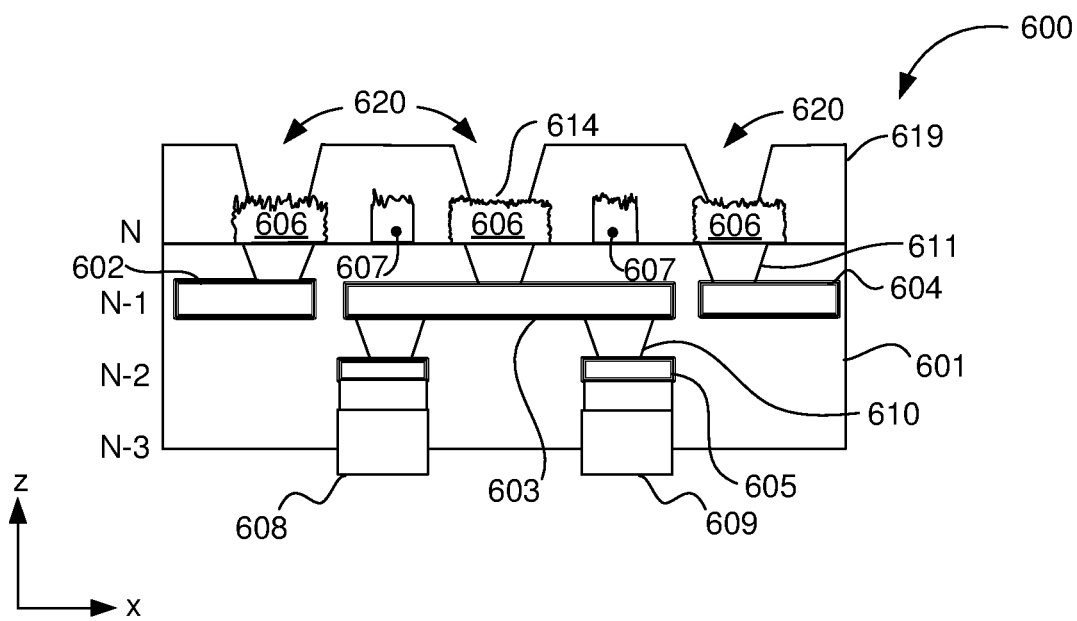
Figure 6E:
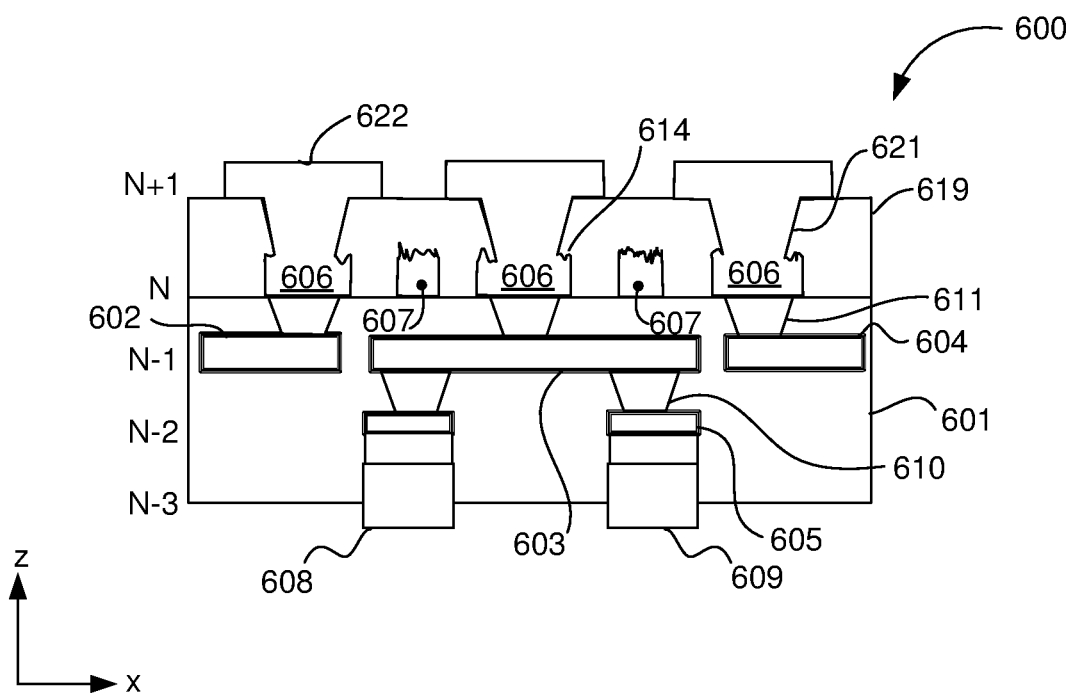

Referring to FIGS. 6D and 6E, dielectric layer 619 is laminated over conductive features 606 and 607 in metallization level N. Via openings 620 may be formed over non-HSIO conductive features by laser drilling. In the illustrated example, non-HSIO conductive features are landing pads for vias 621, plated into openings 620 by electrodeposition of copper or a suitable alloy of copper. New non-HSIO conductive features 622 may be formed in metallization level N+1 over the surface of dielectric layer 619 adjacent to vias 621. Non-HSIO conductive features 606 in metallization level N extend laterally beyond bases of vias 621. As described above, a peripheral region of roughened top surfaces 614 may form an interface with bulk dielectric material in dielectric layer 619, and may increase adhesion strength of adjacent dielectric material in dielectric layer 619.

Figure 7:
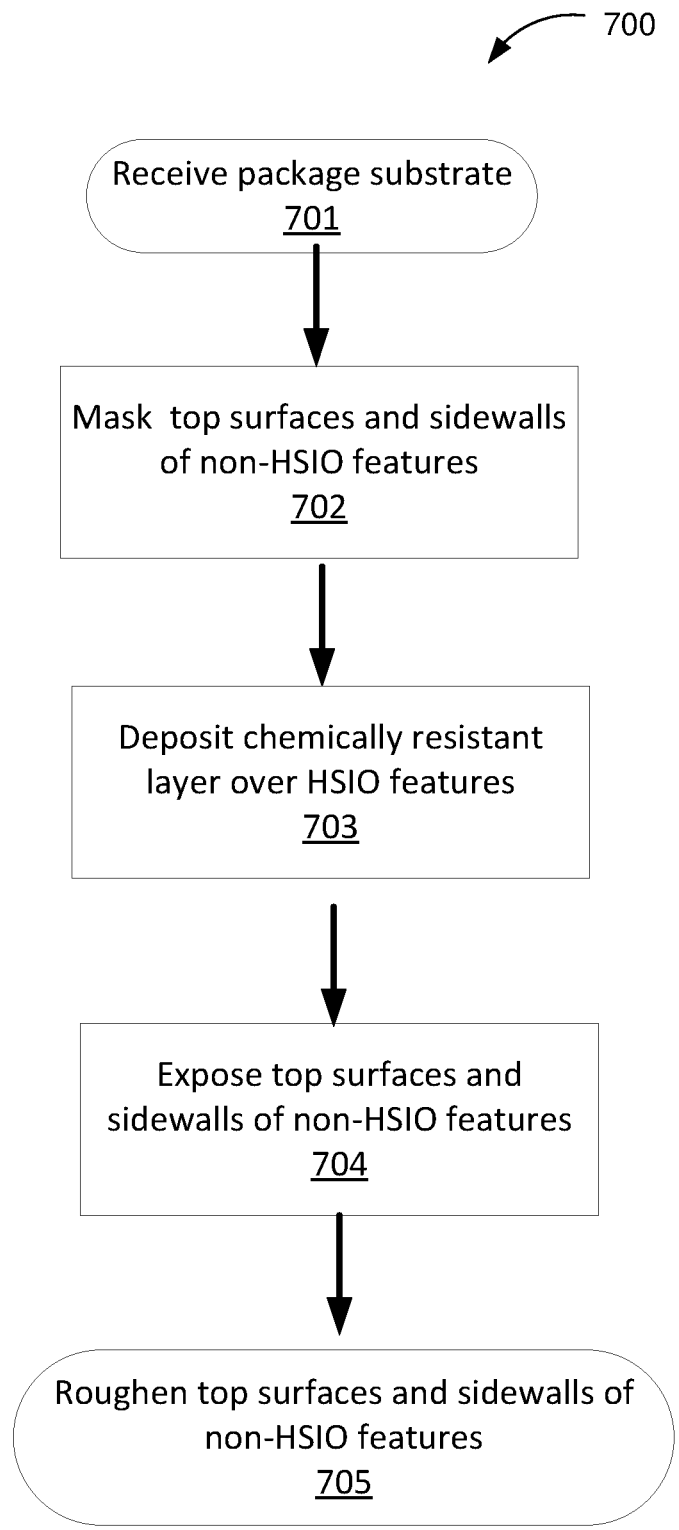
FIG. 7 illustrates a flow chart summarizing an exemplary method for making a package substrate comprising selectively roughened top sides and sidewalls of non-HSIO conductive features, employing a permanent protective layer over HSIO conductive features to maintain smooth surface finish of HSIO conductive feature sidewalls and top surface, according to some embodiments of the disclosure.

FIG. 7 illustrates flow chart 700 summarizing an exemplary method for making a package substrate comprising selectively roughened top sides and sidewalls of non-HSIO conductive features, employing a permanent protective layer over HSIO conductive features to maintain smooth surface finish of HSIO conductive feature sidewalls and top surface, according to some embodiments of the disclosure.

At operation 701, a partial package substrate similar to package substrate of operation 101 and described above is received in-process for fabrication selective three-sided and one-sided roughening of both HSIO and non-HSIO conductive features, according to some embodiments. The description of the partial package substrate is substantially the same as that given above in the description of operation 101. The as-received partial package substrate comprises a top-level (e.g., surface) metallization plane comprising HSIO and non-HSIO conductive features that may exhibit a smooth surface finish (e.g., having an average surface roughness $Ra_1 < 200$ nm). These top-level conductive features are subject to the subsequent process operations.

At operation 702, a sacrificial photomask may be laminated or coated over the top metallization level, covering all surfaces (e.g., top surfaces and sidewalls) of all top-level conductive features. As noted above, the photomask may be a photoresist (e.g., a dry film resist) or a hard mask (e.g., a chromium or silicon nitride thin film). Alternatively, a sacrificial hard mask may be formed by deposition of a metallic or non-metallic thin film, such as chromium, nickel, aluminum, copper, tin, cobalt, silicon carbide, aluminum oxide, aluminum nitride, boron nitride, silicon oxide or silicon nitride. A photomask pattern may be lithography defined to form openings over HSIO features, exposing all surfaces, while covering non-HSIO features remain covered by the photomask.

At operation 703, following development of the photomask pattern, a thin (e.g., less than 100 nm) layer of a secondary material that is substantially resistant to the roughening etch is blanket deposited over the photomask and exposed HSIO features. The secondary material may be deposited over the HSIO features as a permanent protective layer, not to be intentionally removed. The secondary material may be resistant to chemical attack by the etchant. In some embodiments, the secondary material may comprise gold, silver, nickel, tungsten, cobalt, molybdenum, titanium, titanium oxide, silicon carbide, silicon nitride, silicon oxynitride, aluminum oxide, aluminum nitride or gallium nitride. In some embodiments, the sacrificial material comprises an organofluorine polymer, such as compounds related to poly tetrafluoroethylene (PTFE), fluorinated ethylene-propylene (FEP), etc. In some embodiments, the secondary material may comprise a self-assembled monolayer (SAM) of a suitable chemically-resistant substance such as a perfluoroalkyl thiol (e.g., alkyl chain terminated by a sulfhydryl group), whereby the thiol group covalently anchors the perfluoroalkyl chain to a metal surface. The perfluoroalkyl thiol may be optionally terminated by a primary or secondary amino group, or other suitable group at the free end of the alkyl chain to control local or surface chemistry. Other suitable molecules amenable to form SAM layers are also possible.

At operation 704, the remaining photomask is stripped, exposing non-HSIO features. By removal of the photomask, all three sides of the non-HSIO features are exposed, including the top surfaces and sidewalls. Secondary material covering the remaining photomask features is also removed in this process.

At operation 705, a roughening etch is performed. Only surfaces of the non-HSIO features within the metallization plane are roughened in a three-sided attack. The HSIO surfaces are left untouched, as the protective layer comprising the secondary material may shield all covered surfaces of HSIO features from chemical attack. Post treatment, the secondary material may remain over the HSIO features as a permanent thin film, as no intentional treatment to remove it may be undertaken. Subsequent lamination or deposition of substrate dielectric may cover the roughened non-HSIO features and the protective layer over the HSIO features. The protective film may also be advantageous to control the dielectric environment around the HSIO trace, for example, by being engineered to have a significantly different dielectric constant than that of the package dielectric material.

FIGS. 8A-8F illustrate operational cross-sectional views in the x-z plane of an exemplary method as outlined in FIG. 7 for fabricating package substrate 800 comprising selectively roughened non-HSIO conductive features and HSIO features covered by a permanent protective layer, according to some embodiments of the disclosure.

Figure 8A:
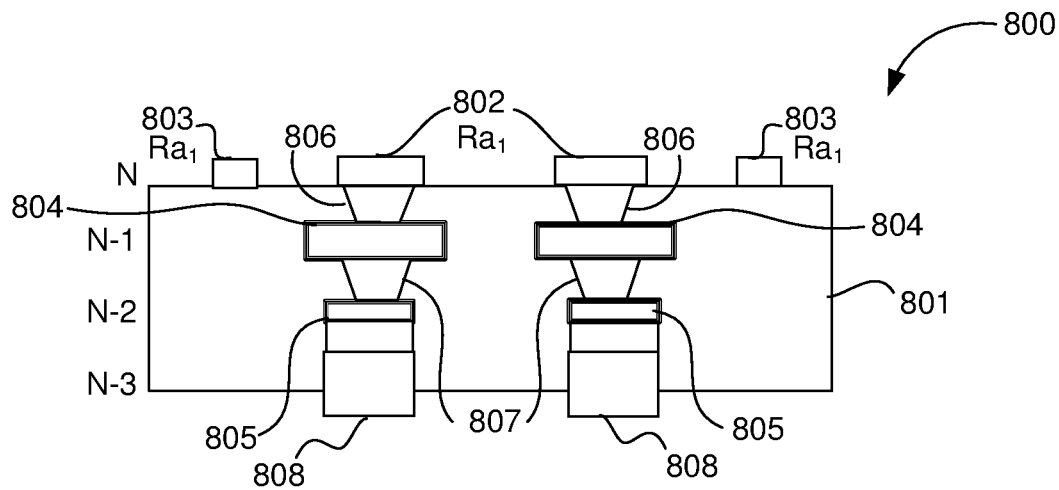
FIGS. 8A-8F illustrate operational cross-sectional views in the x-z plane of an exemplary method as outlined in FIG. 7 for fabricating a package substrate comprising selectively roughened buried non-HSIO conductive features and buried HSIO features covered by a permanent protective layer, according to some embodiments of the disclosure.

Referring to FIG. 8A, package substrate 800 is shown at an intermediate stage of build-up, comprising top-level (e.g., level N) metallization features 802 and 803 over package dielectric material 801. In the illustrated embodiment, conductive features 802 are non-HSIO pads, whereas conductive features 803 are HSIO traces. Package substrate comprises buried conductive features such as pads 804 and 805 in adjacent conductor planes (in descending order) N−1 and N−2, respectively, embedded within dielectric 801. Additional metallization planes may be present below bottom level N−3 (e.g., N−4, N−5, etc.). Pads 807 within bottom (in the example) metallization level N−3 are landside interconnects for bonding package substrate 800 to a printed circuit board or other substrate (not shown).

Conductive features 804 and 805 may be buried pads within dielectric, for example, having thicknesses ranging between 10 and 50 microns. In some embodiments, pads 804 and 805 are landing pads for vias 806 and 807, interconnecting metallization levels N, N−1 and N−2. Land interconnects 808 are within bottom metallization level N−3. Interconnects (e.g., lands) 808 may be integral with buried pads 805 or connected thereto by vias (not shown). In some embodiments, all conductive features 802-808 comprise copper or an alloy of copper.

Figure 8B:
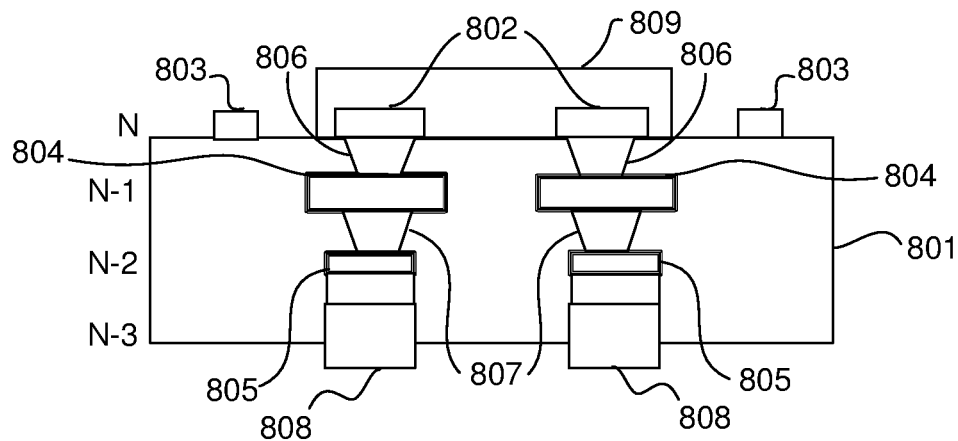
Figure 8C:
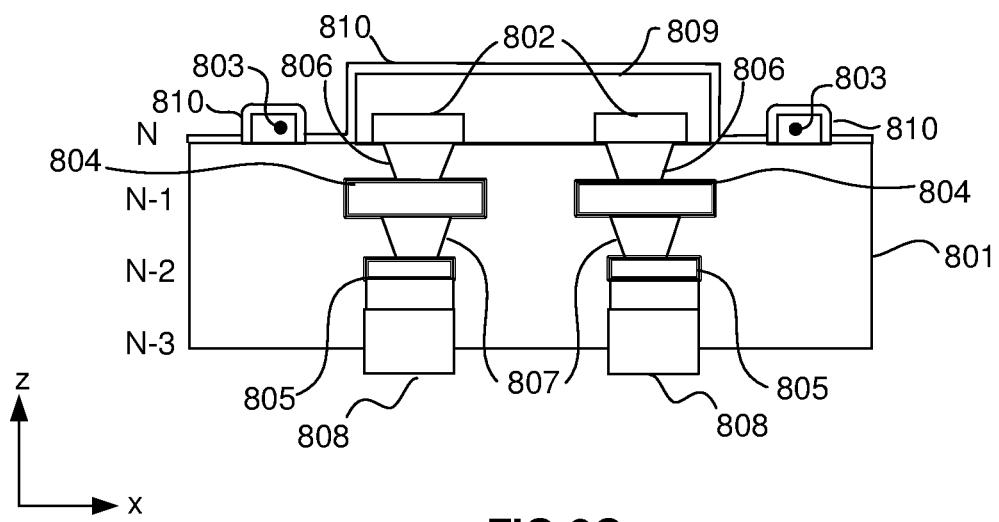

Referring to FIGS. 8B and 8C, several operations are combined, culminating in the illustrated examples. Photomask 809 is applied over package substrate 801 and patterned, covering non-HSIO conductive features 802 while forming openings exposing HSIO conductive features 803 and adjacent dielectric material 801, as shown. Photomask 809 may be an organic photoresist (e.g., a dry film resist), or a hard mask as described above. Protective layer 810 comprising a secondary material, as described above, is conformally deposited over package substrate 800, covering HSIO conductive features 803 and adjacent dielectric 801, as well as photomask 809. Protective layer 810 may be a metallic, non-metallic or organic film (including a SAM) comprising materials resistant to the etching chemistry as described above, having a thickness ranging from 10 to 1000 nm. In some embodiments, protective layer 810 is deposited by chemical vapor deposition, dc or rf sputtering. In some embodiments, protective layer is a self-assembled monolayer (SAM) comprising an alkyl thiol, as described above.

Figure 8D:
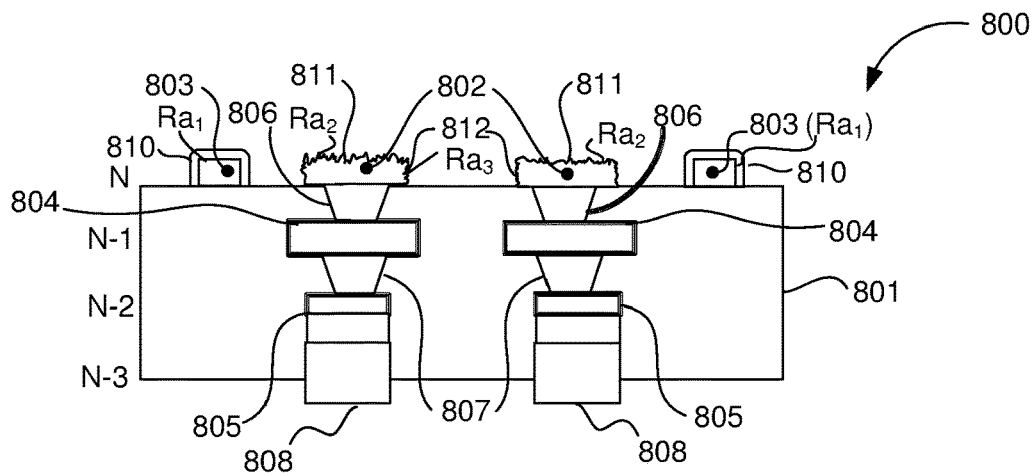

Referring to FIG. 8D, several operations are again combined to arrive at the illustrated example. Photomask 809 is stripped, exposing non-HSIO features 802. Portions of protective layer 810 covering photomask 809 are removed with photomask 809. In the illustrated example, protective layer 810 is also removed over dielectric 801 adjacent to HSIO features 803, leaving only HSIO features 803 covered by protective layer 810.

A roughening etch is subsequently applied to top level metallization features, causing a three-sided chemical attack on non-HSIO features 802, roughening the finish of all surfaces to an average surface roughness $Ra_2$ for top surfaces 811 and $Ra_3$ for sidewalls 812 of non-HSIO features 802. As noted above, $Ra_2$ and $Ra_3$ may be substantially the same. In some embodiments, $Ra_1 < Ra_3 < Ra_2$. Protective layer 810 may completely shield surfaces of HSIO features 803 from the etchant, enabling conservation of the as-plated surface finish, having an average surface roughness $Ra_1 < 150$ nm.

As noted above, protective layer 810 may be a permanent layer covering HSIO conductive features. Protective layer 810 may be engineered to provide a dielectric environment that may be more advantageous than that provided by package dielectric 801 alone. As an example, the permittivity (e.g., dielectric constant) of protective layer 810 may be smaller than the permittivity of package dielectric 801, reducing capacitive coupling between adjacent traces. With reduced coupling, the insertion loss of HSIO features, such as HSIO traces, may be adjusted in a deliberate manner by judicious selection of a composition of protective layer 810. Similarly, a magnetic core material composition (e.g., a ferrite composite) of protective layer 810 may reduce inductive coupling between adjacent traces and other metal structures within package substrate 800 by confining magnetic fields to the vicinity of the HSIO traces.

Figure 8E:
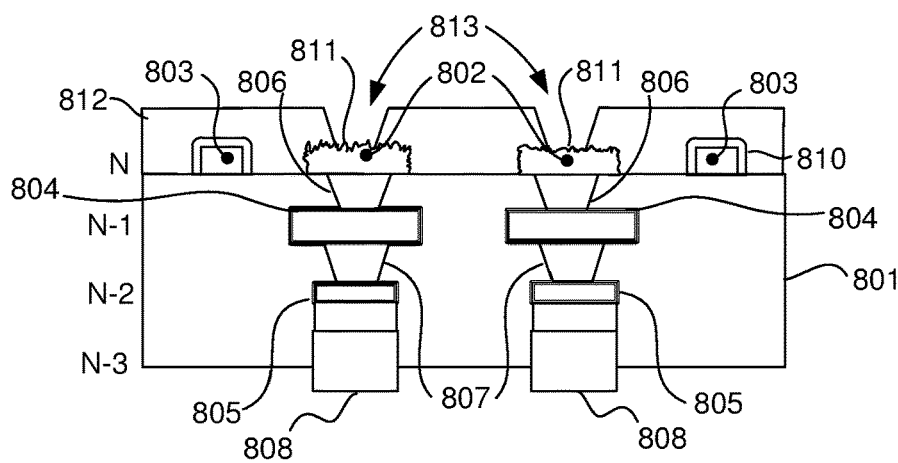
Figure 8F:
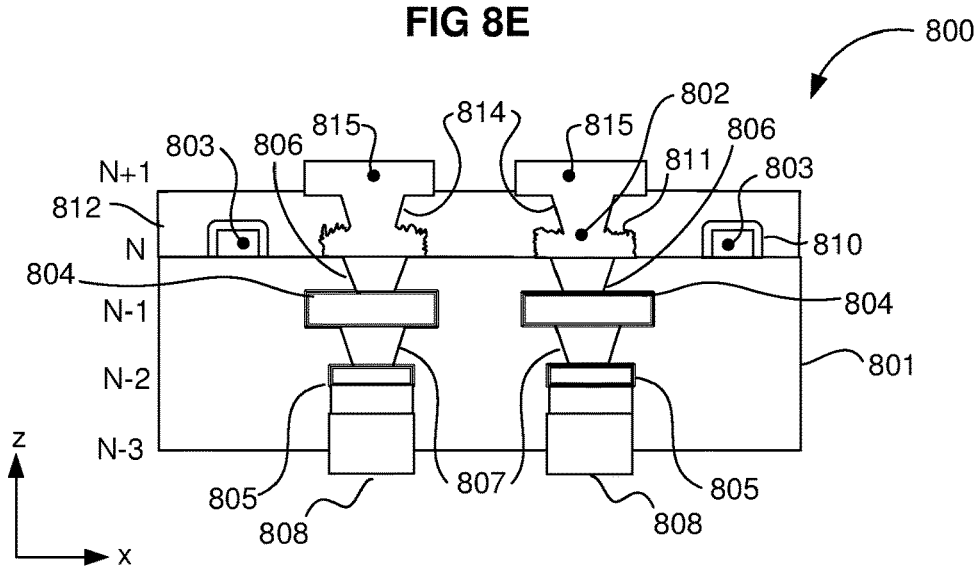

Referring to FIGS. 8E and 8F, dielectric layer 812 is laminated over conductive features 802 and 803 in metallization level N. Via openings 813 may be formed over non-HSIO conductive features by laser drilling. In the illustrated example, non-HSIO conductive features are landing pads for vias 814 formed by electrodeposition (e.g., galvanic or electroless deposition) copper or a suitable alloy of copper into openings 813. New non-HSIO conductive features 815 may be formed in metallization level N+1 over the surface of dielectric layer 812 adjacent to vias 814. Non-HSIO conductive features 802 in metallization level N extend laterally beyond bases of vias 814. As described above, a peripheral region of roughened top surfaces 811 may form an interface with bulk dielectric material in dielectric layer 812, and may increase adhesion strength of adjacent dielectric material in dielectric layer 812.

Figure 9:
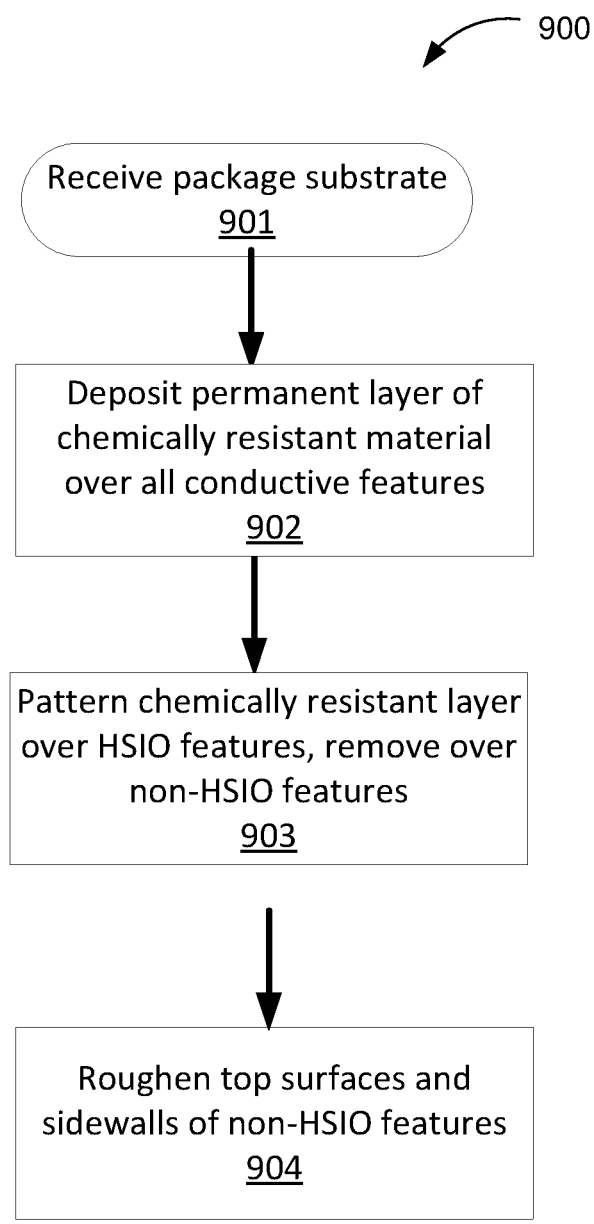
FIG. 9 illustrates a flow chart summarizing an exemplary method for making a package substrate comprising selectively roughened top sides and sidewalls of non-HSIO conductive features, employing a permanent protective layer over HSIO conductive features to maintain smooth surface finish of HSIO conductive feature sidewalls and top surface, according to some embodiments of the disclosure.

FIG. 9 illustrates flow chart 900 summarizing an exemplary method for making a package substrate comprising selectively roughened top sides and sidewalls of non-HSIO conductive features, employing a permanent protective layer over HSIO conductive features to maintain smooth surface finish of HSIO conductive feature sidewalls and top surface, according to some embodiments of the disclosure.

At operation 901, a partial package substrate similar to package substrate of operation 101 and described above is received in-process for fabrication selective three-sided and one-sided roughening of both HSIO and non-HSIO conductive features, according to some embodiments. The description of the partial package substrate is substantially the same as that given above in the description of operation 101. The as-received package substrate is partially complete, comprising an exposed top-level (e.g., surface) metallization plane comprising HSIO and non-HSIO conductive features that may exhibit a smooth surface finish (e.g., having an average surface roughness $Ra_1 < 200$ nm). These top-level conductive features are subject to the subsequent process operations.

The process described in the following paragraphs is a variation of the process outlined in FIG. 7 and depicted in FIGS. 8A-8F.

At operation 902, a layer having a thickness between 0-5 microns of a secondary material (e.g., described above) that is substantially resistant to the roughening etch is first blanket deposited over the exposed metallization layer, including HSIO and non-HSIO conductive features, whereby the protective layer is in direct contact with both non-HSIO and HSIO conductive features. The protective layer may comprise a secondary material, as has been described above.

At operation 903, the protective layer is patterned for subsequent removal over selected features. In some embodiments, a photomask is deposited over the protective layer after its deposition and patterned to form lithographically-defined openings over non-HSIO features, while covering HSIO features. The photomask may be an etch mask to pattern the protective layer, where material exposed in openings may be removed by a suitable etch, for example. In an alternative procedure, no photomask is employed, and protective material is ablated by a scanning laser.

At operation 904, exposed surfaces of non-HSIO conductive features are roughened by the mild etchant in a three-sided roughening etch attack. HSIO features may be completely shielded from the etchant by the protective layer, conserving the as-deposited finish (e.g., $Ra_1$) of the top surface and sidewalls. The chemical treatment of surfaces of non-HSIO features may achieve an average surface roughness of $Ra_2$ on the top surfaces and sidewalls, or an average surface roughness of $Ra_2$ on the top surface and an average surface roughness $Ra_3$ on the sidewalls, where $Ra_2 > Ra_3$. In some embodiments, $Ra_2$ and $Ra_3$ are substantially different values, as noted above. In some embodiments $Ra_2$ and $Ra_3$ are substantially the same. The protective layer may be a permanent layer over the HSIO features, or may be removed subsequent to the roughening etch.

After the roughening etch is completed, the package substrate may undergo further build-up cycles. For example, a layer of package dielectric may be laminated over the top metallization plane, embedding the roughened non-HSIO features and the smooth HSIO features, which may be encapsulated by the protective layer. The dielectric layer may be prepared for formation of a higher metallization level.

FIGS. 10A-10F illustrate operational cross-sectional views in the x-z plane of an exemplary method as outlined in FIG. 9 for fabricating package substrate 1000 comprising selectively roughened buried non-HSIO conductive features and buried HSIO features covered by a permanent protective layer, according to some embodiments of the disclosure.

Figure 10A:
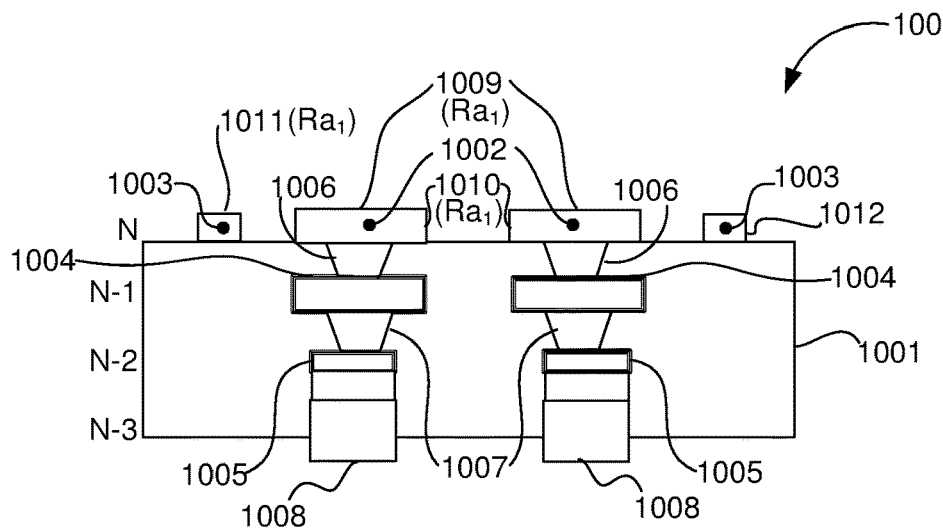
FIGS. 10A-10F illustrate operational cross-sectional views in the x-z plane of an exemplary method as outlined in FIG. 9 for fabricating a package substrate comprising selectively roughened buried non-HSIO conductive features and buried HSIO features covered by a permanent protective layer, according to some embodiments of the disclosure.

Referring to FIG. 10A, package substrate 1000 is shown at an intermediate stage of fabrication, comprising top-level (e.g., level N) metallization features 1002 and 1003 over package dielectric material 1001. In the illustrated embodiment, conductive features 1002 are non-HSIO pads, whereas conductive features 1003 are HSIO traces. Package substrate comprises buried conductive features such as pads 1004 and 1005 in adjacent conductor planes (in descending order) N−1 and N−2, respectively, embedded within dielectric 1001. Additional metallization planes may be present below bottom level N−3 (e.g., N−4, N−5, etc.). Conductive features 1004 and 1005 may be buried pads within dielectric, for example, having thicknesses ranging between 10 and 50 microns. In some embodiments, pads 1004 and 1005 are landing pads integral with vias 1006 and 1007, interconnecting metallization levels N, N−1 and N−2. Land interconnects 1008 are within bottom metallization level N−3. Land interconnects (e.g., lands) 1008 may be integral with buried pads 1005 or connected thereto by vias (not shown). In some embodiments, all conductive features 1002-1008 comprise copper or an alloy of copper.

In the illustrated embodiment, non-HSIO conductive features 1002 of the as-received package substrate 1000 include top surfaces 1009 and sidewalls 1010 having an average surface roughness $Ra_1 < 150$ nm. Likewise, HSIO conductive features 1003 include top surfaces 1011 and sidewalls 1012, also having a surface finish characterized by an average surface roughness $Ra_1$. In some embodiments, $Ra_1$ may be the as-plated surface finish of the metallization plane.

Figure 10B:
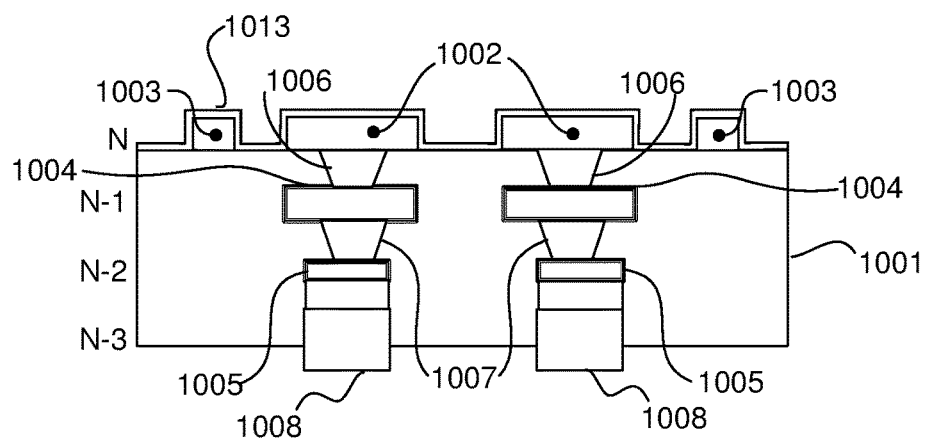

Referring to FIG. 10B, protective layer 1013 is blanket deposited over package substrate 1000, covering both non-HSIO features 1002 and HSIO features 1003. As noted above, protective layer 1009 may be laminated, coated or deposited by lamination, coater, CVD or a sputtering process to a thickness ranging between 0 and 10 um. The composition of protective layer 1013 has been described above. Protective layer 1013 may comprise a material amenable to patterning by chemical etch or laser ablation.

Figure 10C:
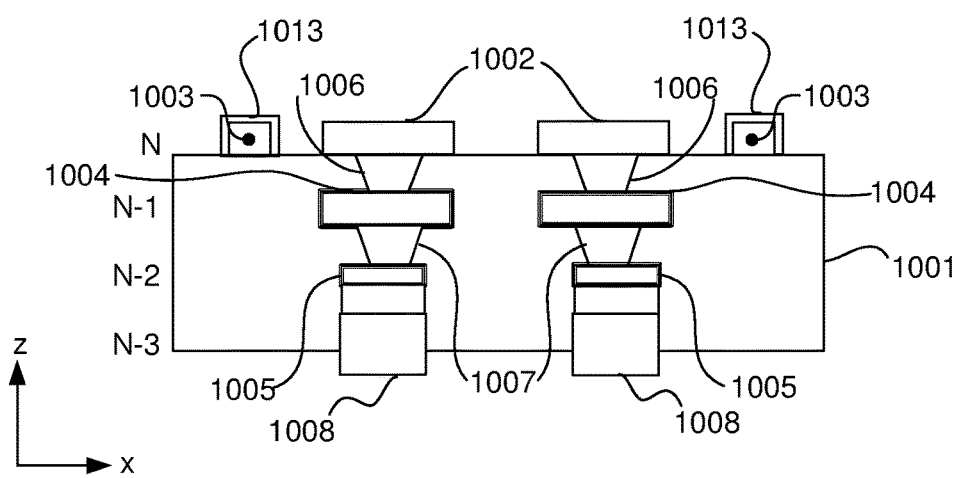

Referring to FIG. 10C, protective layer 1013 is patterned according to the architecture of the metallization plane, following the distribution of HSIO and non-HSIO features. Accordingly, protective layer 1013 remains over HSIO features 1003 (and may extend over adjacent dielectric material) and is removed over non-HSIO features, as shown. Protective layer 1013 may be patterned by etching through a lithographically-defined photomask. Alternatively, protective layer 1013 may be patterned by ablation, employing a scanning laser, circumventing lithographic operations.

Figure 10D:
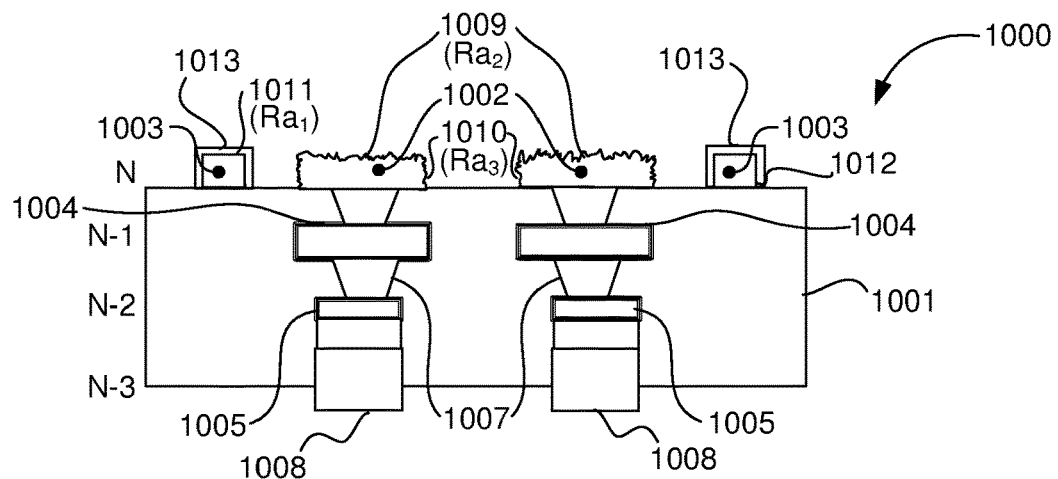

Referring to FIG. 10D, a roughening etch is applied to top level metallization features, causing a three-sided chemical attack on non-HSIO features 1002, roughening the finish of all surfaces to an average surface roughness $Ra_2$ for top surfaces 1009 and $Ra_3$ for sidewalls 1010 of non-HSIO features 1002. As noted above, $Ra_2$ and $Ra_3$ may be substantially the same. In some embodiments, $Ra_1 < Ra_3 < Ra_2$. Protective layer 1013 may completely shield surfaces of HSIO features 1003 from the etchant, enabling conservation of the as-plated surface finish, having an average surface roughness $Ra_1 < 150$ nm. As noted above, protective layer 1013 may be a permanent layer covering HSIO conductive features.

Figure 10E:
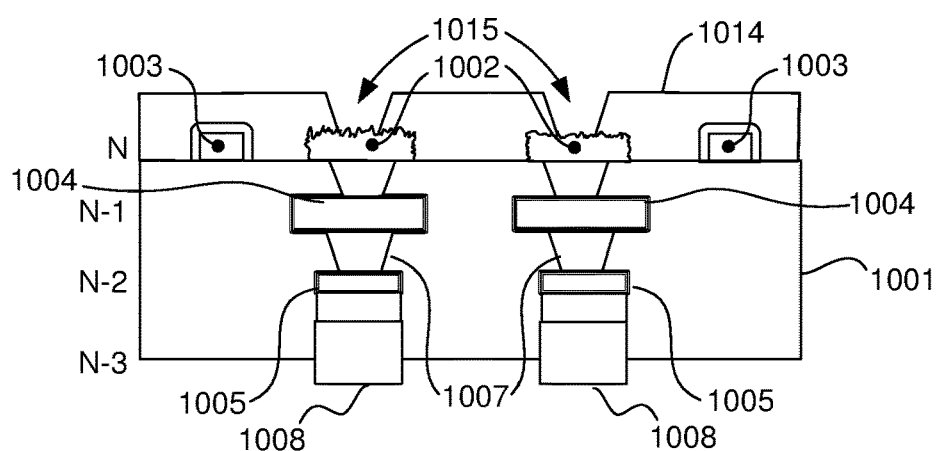
Figure 10F:
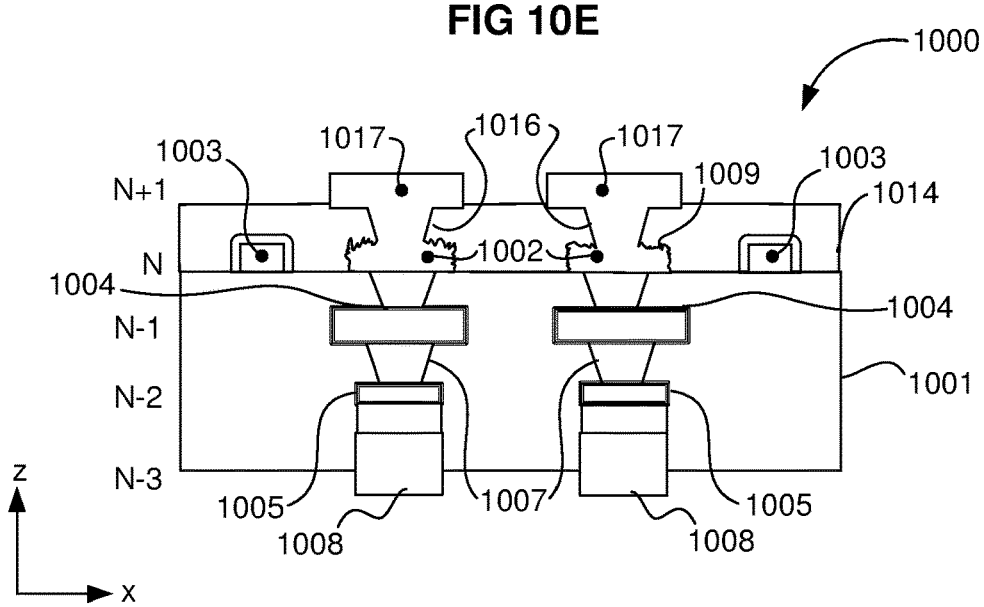

Referring to FIGS. 10E and 10F, dielectric layer 1014 is laminated over conductive features 1002 and 1003 in metallization level N. Via openings 1015 may be formed over non-HSIO conductive features by laser drilling. In the illustrated example, vias 1016 are formed by electrodeposition (e.g., galvanic or electroless deposition) copper or a suitable alloy of copper into openings 1015. New non-HSIO conductive features 1017 may be formed in metallization level N+1 over the surface of dielectric layer 1014 adjacent to vias 1016. Non-HSIO conductive features 1002 in metallization level N extend laterally beyond bases of vias 1016. As noted above, a peripheral region of roughened top surfaces 1009 may form an interface with bulk dielectric material in dielectric layer 1014, and may increase adhesion strength of adjacent dielectric material in dielectric layer 1014.

Figure 11:
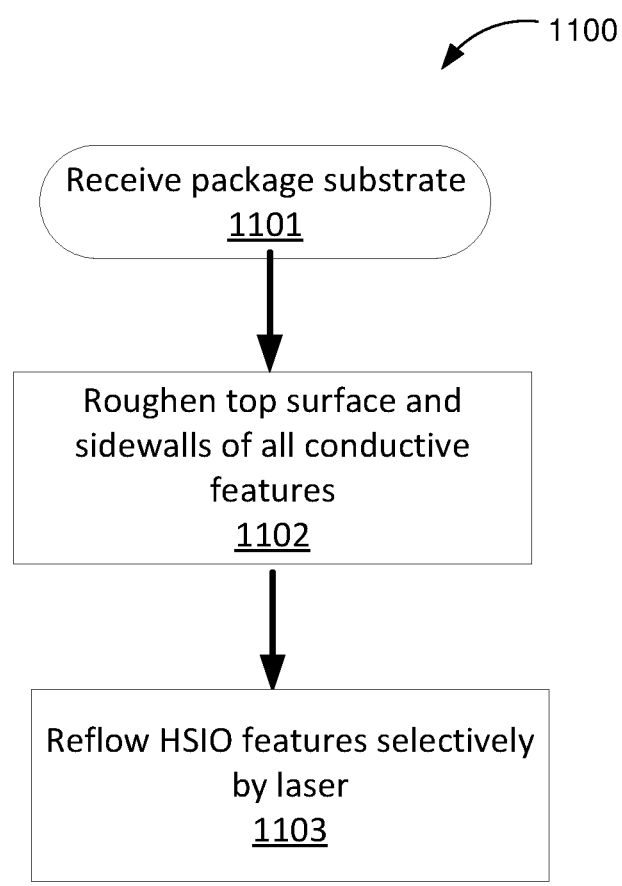
FIG. 11 illustrates a flow chart summarizing an exemplary method for making a package substrate comprising selectively roughened top sides and sidewalls of non-HSIO conductive features, and reflow-polished surfaces of HSIO conductive features, according to some embodiments of the disclosure.

FIG. 11 illustrates flow chart 1100 summarizing an exemplary method for making a package substrate comprising selectively roughened top sides and sidewalls of non-HSIO conductive features, and reflow-polished surfaces of HSIO conductive features, according to some embodiments of the disclosure.

At operation 1101. a partial package substrate similar to package substrate of operation 101 and described above is received in-process for fabrication selective three-sided and one-sided roughening of both HSIO and non-HSIO conductive features, according to some embodiments. The description of the partial package substrate is substantially the same as that given above in the description of operation 101. The as-received partial package substrate comprises a top-level (e.g., surface) metallization plane comprising HSIO and non-HSIO conductive features that may exhibit a smooth surface finish (e.g., having an average surface roughness $Ra_1 < 150$ nm). These top-level conductive features are subject to the subsequent process operations.

At operation 1102, the as-received package substrate is directly subjected to a non-selective roughening etch, where all surfaces of both HSIO and non-HSIO features are exposed and may be attacked simultaneously. Masking of feature surfaces is not required, as selected HSIO conductive features are to be selectively annealed and polished by directed laser heating, as described in the following paragraphs.

At operation 1103, roughened HSIO conductive features are selectively smoothed by laser heating. In this process, the roughened HSIO surfaces are annealed by selective reflow polishing (partial melting) resulting in localized heating by the laser beam. The beam may be energized to induce ablation of materials. Heat from the laser beam may induce a reflow process, causing a melding of top surfaces and sidewalls, blurring corners and edges, in addition to annealing surface roughness. The HSIO feature profiles may have a distinct curvature after the laser reflow operation. Ablation of adjacent dielectric material may also occur, leaving a damage zone surrounding to the individual HSIO features. The damage zone may include ablated metal particles and melted and/or charred dielectric material debris. The resulting surface finish of the HSIO features may have an average surfaces roughness less than the initial as-plated value of $Ra_1$.

FIGS. 12A-12F illustrate operational cross-sectional views in the x-z plane of an exemplary method as outlined in FIG. 11 for fabricating package substrate 1200 comprising selectively roughened non-HSIO conductive features and HSIO features smoothed by laser reflow polishing, according to some embodiments of the disclosure.

Figure 12A:
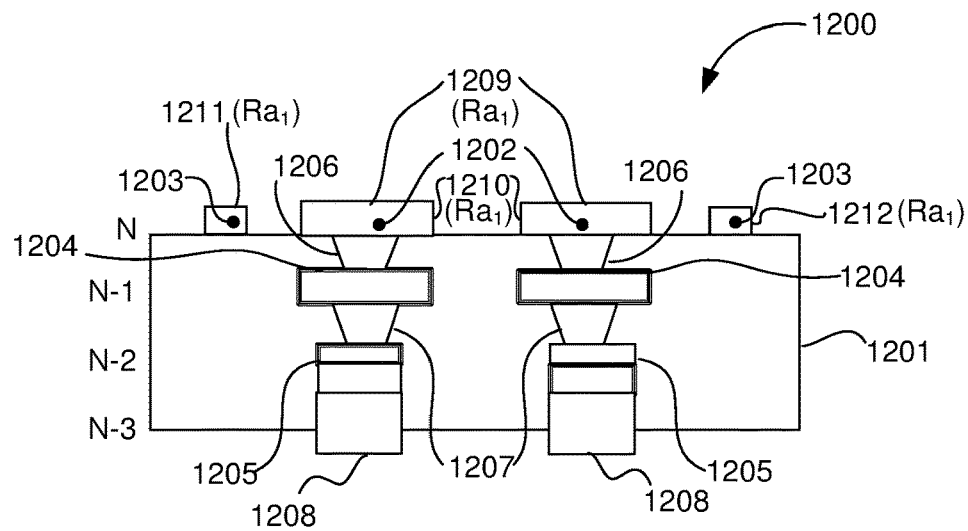
FIGS. 12A-12F illustrate operational cross-sectional views in the x-z plane of an exemplary method as outlined in FIG. 11 for fabricating a package substrate comprising selectively roughened non-HSIO conductive features and HSIO features smoothed by laser reflow polishing, according to some embodiments of the disclosure.

Referring to FIG. 12A, package substrate 1200 is shown at an intermediate stage of fabrication, comprising top-level (e.g., level N) metallization features 1202,1203a and 1203b over package dielectric material 1201. In the illustrated embodiment, conductive features 1202 may be non-HSIO pads, whereas conductive features 1203a and 1203b may be HSIO traces. Package substrate comprises buried conductive features such as pads 1204 and 1205 in adjacent conductor planes (in descending order) N-1 and N-2, respectively, embedded within dielectric 1201. In some embodiments, pads 1204 and 1205 are landing pads integral with vias 1206 and 1207, interconnecting metallization levels N, N-1 and N-2. Land interconnects 1208 are within bottom metallization level N-3. Land interconnects (e.g., lands) 1208 may be integral with buried pads 1205 or connected thereto by vias (not shown). In some embodiments, all conductive features 1202-1208 comprise copper or an alloy of copper.

In the illustrated embodiment, non-HSIO conductive features 1202 of the as-received package substrate 1200 include top surfaces 1209 and sidewalls 1210 having an average surface roughness $Ra_1 < 150$ nm. Likewise, HSIO conductive features 1203a and 1203b include top surfaces 1211 and sidewalls 1212, also having a surface finish characterized by an average surface roughness $Ra_1$. In some embodiments, $Ra_1$ may be the as-plated surface finish of the metallization plane.

Figure 12B:
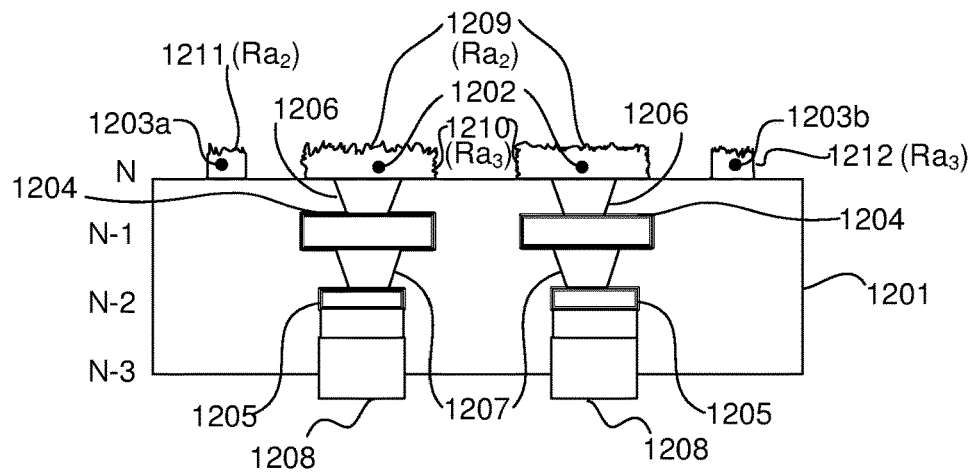

Referring to FIG. 12B. a roughening etch is applied to top level metallization features, causing a three-sided chemical attack on non-HSIO features 1202, roughening the finish of all surfaces to an average surface roughness $Ra_2$ for top surfaces 1209 and $Ra_3$ for sidewalls 1210 of non-HSIO features 1202. As noted above, $Ra_2$ and $Ra_3$ may be substantially the same. In some embodiments, whereby $Ra_1 < Ra_3 < Ra_2$. In some embodiments, $Ra_1 < Ra_3 = Ra_2$.

Figure 12C:
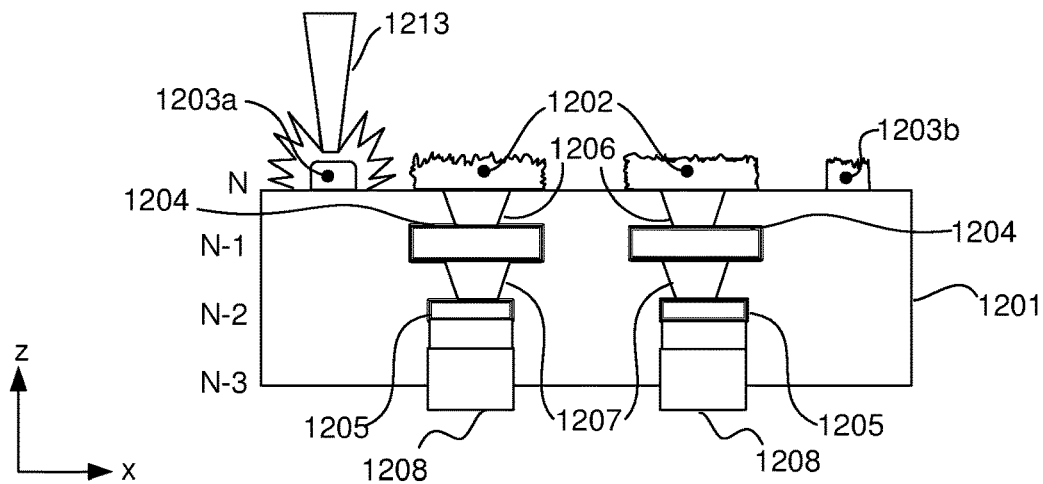

Referring to FIG. 12C. a laser beam 1213 is positioned over an individual HSIO features 1203a (e.g., HSIO feature on the left side of substrate 1200), causing a reflow of the surfaces (e.g., top surface 1211 and sidewalls 1212) by intense heating. Asperities, pits and other surface defects may be annealed, reducing the average surface roughness to a value of $Ra_1$ or less. A reflow of edges and corners may also occur, causing a rounding of edges and surfaces. Depending on the dwell time of laser beam 1213 and final temperature reached within the bulk of the feature, the bulk copper of the HSIO feature 1203a may partially melt and re-solidify, and may transform top surfaces and sidewalls to blend into a spheroidal surface 1214, having an average surface roughness $Ra_4$. In some embodiments, $Ra_4$ is substantially the same as $Ra_2$. In some embodiments, $Ra_4$ is substantially less than $Ra_2$ (e.g., $Ra_4$<100 nm).

During the reflow process, adjacent dielectric material may be ablated and melted as a result, forming damage zone 1215 (delineated by the dashed box) in the immediate vicinity surrounding HSIO feature 1203a. An enlargement of damage zone 1215 is shown in the inset. In addition to localized melting, ablation of material may also occur, ejecting metal particles in the vicinity of HSIO feature 1203a. The material of dielectric 1201 in the vicinity of HSIO feature 1203a may also partially melt and char by the localized heating.

Figure 12D:
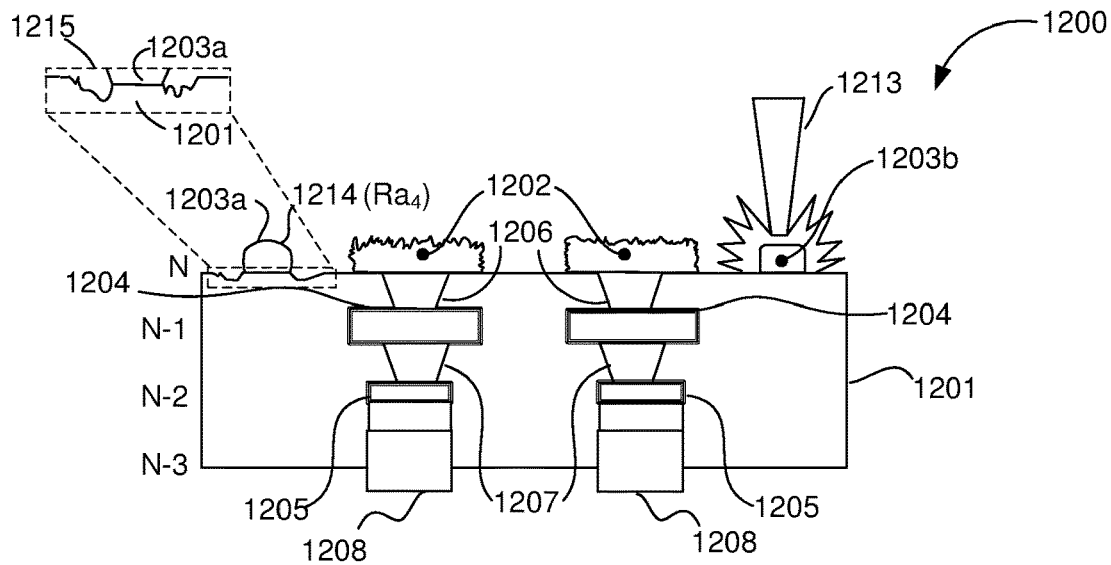
Figure 12E:
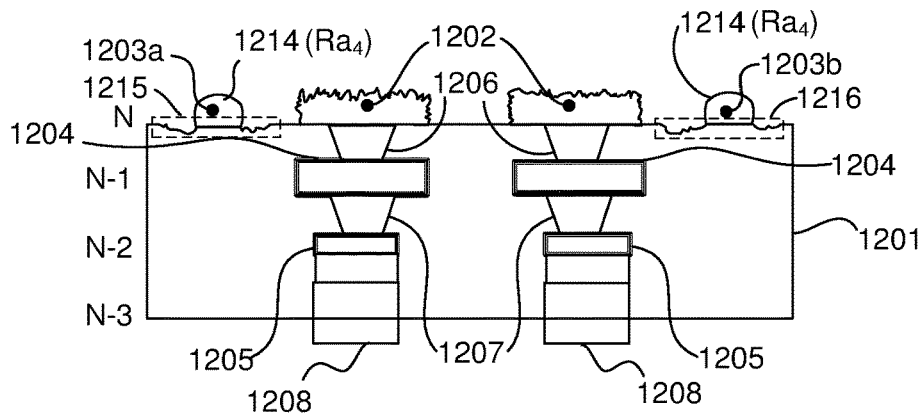

Referring to FIGS. 12D and 12E, laser beam 1213 is positioned over HSIO feature 1203b (on the right side of substrate 1200). Laser beam 1213 may be pulsed to heat HSIO feature 1203b and surrounding dielectric material, creating damage zone 1216 immediately adjacent to HSIO feature 1203b. Surfaces of HSIO feature 1203b (e.g. top surface 1211 and sidewalls 1212) are again partially fused, rounding edges and corners. Top surfaces and sidewalls may be curved after re-solidification, creating an ovoid profile (e.g., cross section) of HSIO feature 1203b, for example.

Figure 12F:
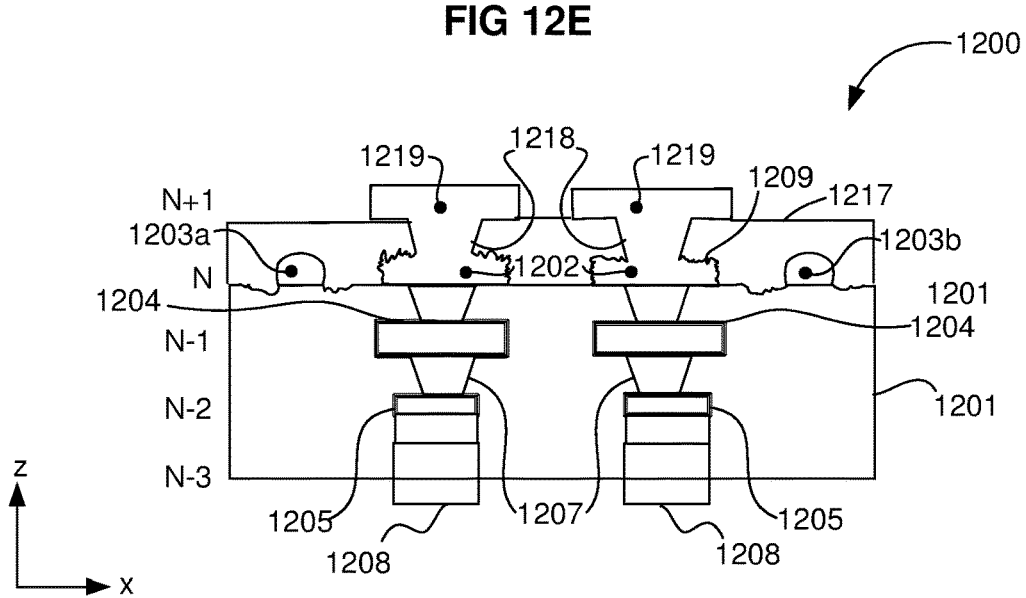

Referring to FIG. 12F, dielectric layer 1217 is laminated over non-HSIO conductive features 1202, including laser-smoothed HSIO conductive features 1203a and 1203b in metallization level N. Damage zones 1215 and 1216 in the vicinity of HSIO features may be backfilled by dielectric layer 1217. In some embodiments, damage zones 1215 and 1216 may form gaps at the interface between dielectric layers 1201 and 1217. Via openings may be formed over non-HSIO features 1202 by laser drilling, as described above. In the illustrated example, vias 1218 are formed by electrodeposition (e.g., galvanic or electroless deposition) copper or a suitable alloy of copper into openings (not shown). New top-level non-HSIO conductive features 1219 may be formed in metallization level N+1 over the surface of dielectric layer 1217 adjacent to vias 1218. Non-HSIO conductive features 1202 in metallization level N extend laterally beyond bases of vias 1218. As noted above, a peripheral region of roughened top surfaces 1209 may form an interface with bulk dielectric material in dielectric layer 1217, and may increase adhesion strength of adjacent dielectric material in dielectric layer 1217.

Figure 13A:
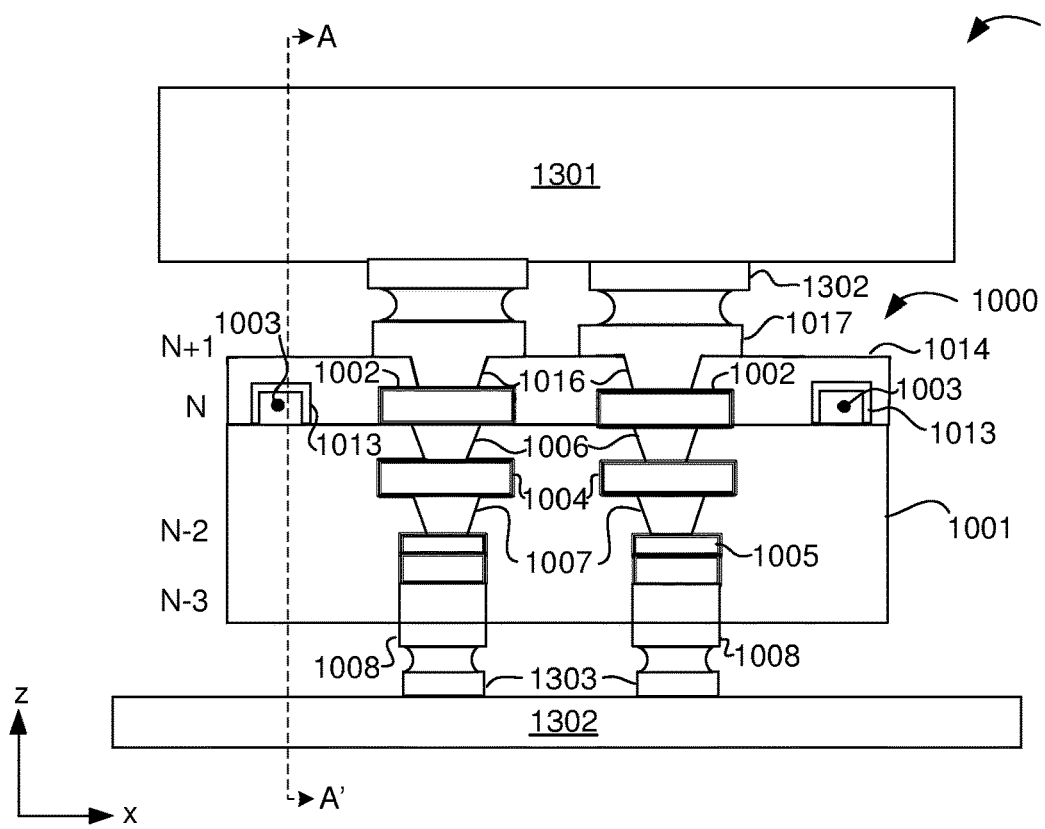
FIG. 13A illustrates a cross-sectional view in the x-z plane of an implementation of a package substrate within an IC package, according to some embodiments of the disclosure.

FIG. 13A illustrates a cross-sectional view in the x-z plane of an implementation of package substrate 1000 within IC package 1300, according to some embodiments of the disclosure.

An implementation of package substrate 1000 comprising selectively roughened conductive features is shown assembled into package 1300, comprising die 1301 bonded to package substrate 1000. Package 1300 is bonded to printed circuit board (PCB) 1302 through land pads 1008 at bottom metallization level N−3. Land pads 1008 may be solder bonded to interconnects 1303 on the top plane of PCB 1302 as shown. Non-HSIO interconnect pads 1017 in the top metallization level N+1 on package substrate 1000 (shown bonded to die pads 1302) may convey power to die 1301 from pads 1302 on PCB 1302. Via stacks comprising vias 1006, 1007 and 1016 may be part of vertical power routing within package substrate 1200. Landing pads 1002, 1004 and 1005 may exhibit a high surface roughness (e.g. $Ra_2$) by selective roughening as described throughout the disclosure, as indicated in the figure by the compound line border of the structures.

Figure 13B:
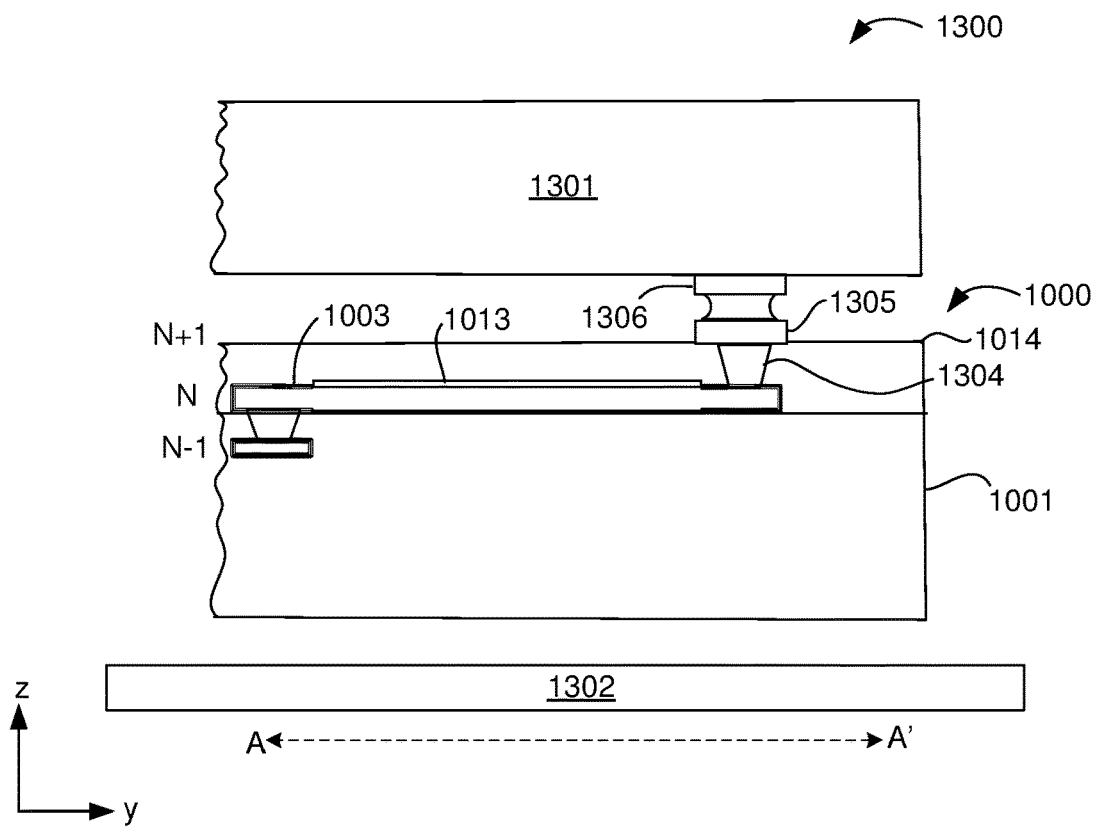
FIG. 13B illustrates a cross-sectional view in the y-z plane of an implementation of a package substrate within an IC package, according to some embodiments of the disclosure.

Cut A-A' is taken along the edge a y-z plane cutting through package 1300 to illustrate interconnections to HSIO conductive feature 1003 in FIG. 13B.

FIG. 13B illustrates a cross-sectional view in the y-z plane of an implementation of package substrate 1000 within package 1300, according to some embodiments of the disclosure.

The cross-sectional view is taken along line A-A' in FIG. 13A. In the illustrated embodiment, HSIO conductive feature 1003 is a HSIO trace viewed along its length (extending in the y-direction). Protective layer 1013 is also shown in long cross-sectional view extending along the top of the HSIO trace. Via 1304 interconnects HSIO trace 1003 to I/O pad 1305 in top level metallization level N+1 on dielectric layer 1014. I/O pad 1305 is solder bonded to I/O interconnect pad 1306 on die 1301. HSIO conductive feature (e.g., HSIO trace) 1003 may be interconnected to high-speed circuitry within die 1301.

Figure 14:
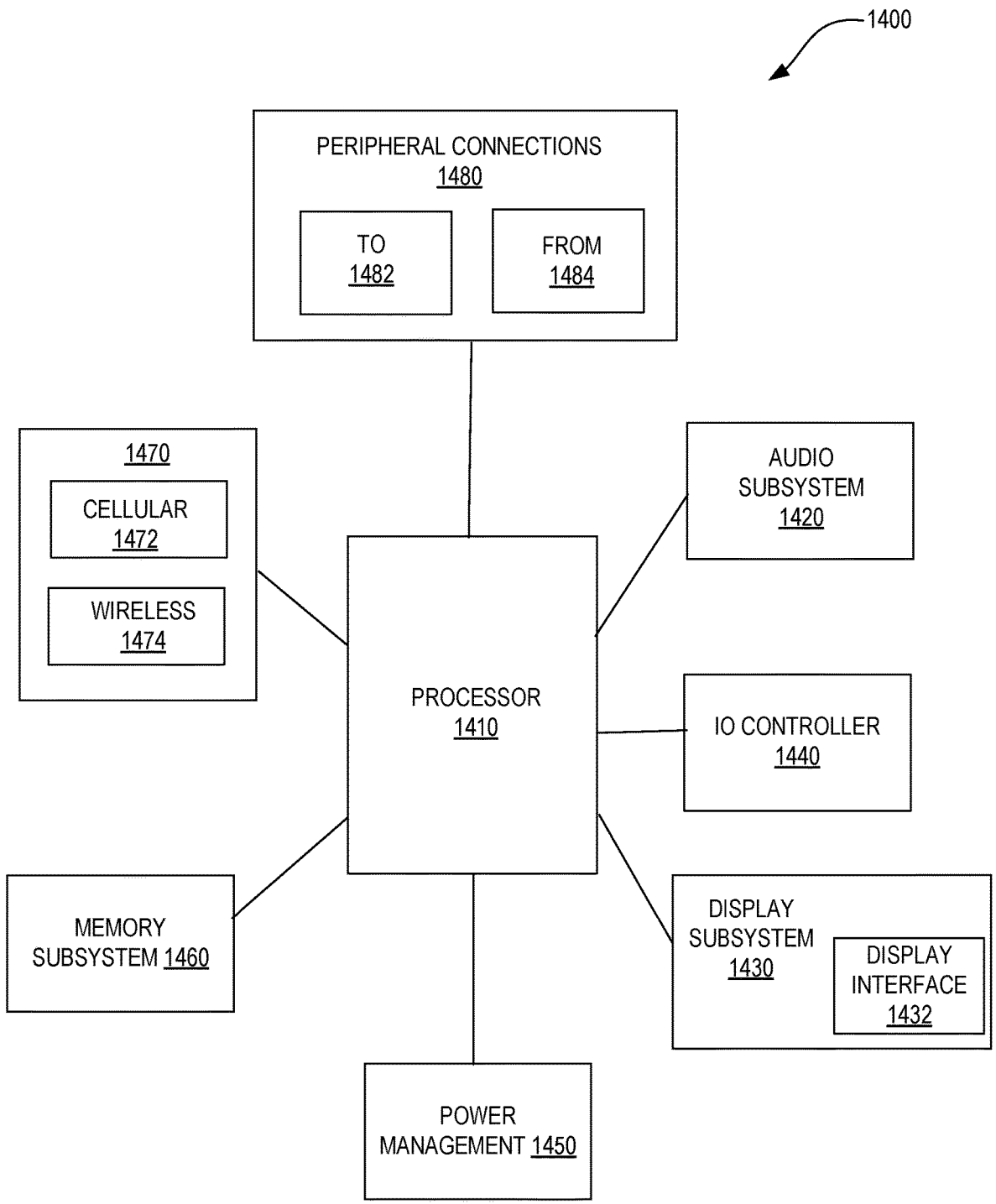
FIG. 14 illustrates a block diagram of a computing device as part of a system-on-chip (SoC) package in an implementation of IC packages comprising selectively roughened conductive features according to some embodiments of the disclosure.

FIG. 14 illustrates a block diagram of computing device 1400 as part of a system-on-chip (SoC) package in an implementation of IC packages comprising selectively roughened conductive features according to some embodiments of the disclosure.

According to some embodiments, computing device 1400 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit) comprises a packages substrate having selectively roughened conductive features within the package substrate, for example. Examples include package substrates 200, 400, 600, 800, 1000 and 1200, as disclosed herein.

In some embodiments, computing device has wireless connectivity (e.g., Bluetooth, WiFi and 5G network). It will be understood that certain components are shown generally, and not all components of such a device are shown in computing device 1400.

The various embodiments of the present disclosure may also comprise a network interface within 1470 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 1410 represents a CPU or a GPU, and can include one or more physical devices, such as microprocessors, application processors, microcontrollers, programmable logic devices, or other processing means. Processor 1410 may comprise selectively roughened conductive features as disclosed. The processing operations performed by processor 1410 include the execution of an operating platform or operating system on which applications and/or device functions are executed. The processing operations include operations related to I/O (input/output) with a human user or with other devices, operations related to power management, and/or operations related to connecting the computing device 1400 to another device. The processing operations may also include operations related to audio I/O and/or display I/O.

In one embodiment, computing device 1400 includes audio subsystem 1420, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1400, or connected to the computing device 1400. In one embodiment, a user interacts with the computing device 1400 by providing audio commands that are received and processed by processor 1410

Display subsystem 1430 represents hardware (e.g., display devices) and software (e.g., drivers) components that provide a visual and/or tactile display for a user to interact with the computing device 1400. Display subsystem 1430 includes display interface 1432 which includes the particular screen or hardware device used to provide a display to a user. In one embodiment, display interface 1432 includes logic separate from processor 1410 to perform at least some processing related to the display. In one embodiment, display subsystem 1430 includes a touch screen (or touch pad) device that provides both output and input to a user.

I/O controller 1440 represents hardware devices and software components related to interaction with a user. I/O controller 1440 is operable to manage hardware that is part of audio subsystem 1420 and/or display subsystem 1430. Additionally, I/O controller 1440 illustrates a connection point for additional devices that connect to computing device 1400 through which a user might interact with the system. For example, devices that can be attached to the computing device 1400 might include microphone devices, speaker or stereo systems, video systems or other display devices, keyboard or keypad devices, or other I/O devices for use with specific applications such as card readers or other devices.

As mentioned above, I/O controller 1440 can interact with audio subsystem 1420 and/or display subsystem 1430. For example, input through a microphone or other audio device can provide input or commands for one or more applications or functions of the computing device 1400. Additionally, audio output can be provided instead of, or in addition to display output. In another example, if display subsystem 1430 includes a touch screen, the display device also acts as an input device, which can be at least partially managed by I/O controller 1440. There can also be additional buttons or switches on the computing device 1400 to provide I/O functions managed by I/O controller 1440.

In one embodiment, I/O controller 1440 manages devices such as accelerometers, cameras, light sensors or other environmental sensors, or other hardware that can be included in the computing device 1400. The input can be part of direct user interaction, as well as providing environmental input to the system to influence its operations (such as filtering for noise, adjusting displays for brightness detection, applying a flash for a camera, or other features).

In one embodiment, computing device 1400 includes power management 1450 that manages battery power usage, charging of the battery, and features related to power saving operation. Memory subsystem 1460 includes memory devices for storing information in computing device 1400. Memory can include nonvolatile (state does not change if power to the memory device is interrupted) and/or volatile (state is indeterminate if power to the memory device is interrupted) memory devices. Memory subsystem 1460 can store application data, user data, music, photos, documents, or other data, as well as system data (whether long-term or temporary) related to the execution of the applications and functions of the computing device 1400.

Elements of embodiments are also provided as a machine-readable medium (e.g., memory 1460) for storing the computer-executable instructions. The machine-readable medium (e.g., memory 1460) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1470 includes hardware devices (e.g., wireless and/or wired connectors and communication hardware) and software components (e.g., drivers, protocol stacks) to enable the computing device 1400 to communicate with external devices. The computing device 1400 could be separate devices, such as other computing devices, wireless access points or base stations, as well as peripherals such as headsets, printers, or other devices.

Network interface 1470 can include multiple different types of connectivity. To generalize, the computing device 1400 is illustrated with cellular connectivity 1472 and wireless connectivity 1474. Cellular connectivity 1472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1474 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1480 include hardware interfaces and connectors, as well as software components (e.g., drivers, protocol stacks) to make peripheral connections. It will be understood that the computing device 1400 could both be a peripheral device ("to" 1482) to other computing devices, as well as have peripheral devices ("from" 1484) connected to it. The computing device 1400 commonly has a "docking" connector to connect to other computing devices for purposes such as managing (e.g., downloading and/or uploading, changing, synchronizing) content on computing device 1400. Additionally, a docking connector can allow computing device 1400 to connect to certain peripherals that allow the computing device 1400 to control content output, for example, to audiovisual or other systems.

In addition to a proprietary docking connector or other proprietary connection hardware, the computing device 1400 can make peripheral connections 1480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) package substrate, comprising a metallization level within a dielectric material, wherein the metallization level comprises a plurality of conductive features each having a top surface and a sidewall surface, wherein the top surface of a first conductive feature of the plurality of conductive features has a first average surface roughness and the sidewall surface of a second conductive feature of the plurality of conductive features has a second average surface roughness that is less than the first average surface roughness.

Example 2 includes all of the features of example 1, wherein the sidewall surface of the first conductive feature has a third average surface roughness that is greater than the second average surface roughness and the top surface of the second conductive feature has a fourth average surface roughness that is greater than the second average surface roughness.

Example 3 includes all of the features of example 1 or 2, wherein the top surface of the second conductive feature has a third average surface roughness that is greater than the second average surface roughness and the side surface of the first conductive feature has a fourth average surface roughness that is less than the first average surface roughness.

Example 4 includes all of the features of any one of examples 1 through 3, wherein the sidewall surface of the first conductive feature has a third average surface roughness that is greater than the second average surface roughness and the top surface of the second conductive feature has a fourth average surface roughness that is less than the first average surface roughness.

Example 5 includes all of the features of example 4, wherein the second conductive feature comprises a first material, and wherein a second material is over the top surface and the sidewall surface of the second conductive feature.

Example 6 includes all of the features of example 5, wherein the second material is any one of gold, silver, aluminum, nickel, tungsten, cobalt, molybdenum, titanium, carbon, hydrogen, silicon, nitrogen, fluorine, chlorine or oxygen.

Example 7 includes all of the features of example 5 or 6, wherein the second material comprises atoms of sulfur and carbon, wherein the atoms of sulfur are covalently bound to the first material, and wherein the atoms of carbon are within an n-hydrocarbon chain comprising at least two atoms of carbon and terminating at an atom of nitrogen, wherein the n-hydrocarbon chain is within a self-assembled monolayer over the top surface and the sidewall surface of the second conductive feature.

Example 8 includes all of the features of example 7, wherein the first material comprises copper or an alloy of copper.

Example 9 includes all of the features of any one of examples 4 through 8, wherein the top surface and sidewall surface of the second conductive features are substantially curved.

Example 10 includes all of the features of any one of examples 1 through 9, wherein the first conductive feature is physically coupled to a via.

Example 11 includes all of the features of example 10, wherein the first conductive feature comprises a pad and the via extends over or under the pad.

Example 12 includes all of the features of any one of examples 1 through 11, wherein the first average surface roughness is not less than twice the second average surface roughness.

Example 13 is a system comprising a microprocessor coupled to a memory within an IC package, wherein the IC package comprises a package substrate comprising a metallization level within a dielectric material, wherein the metallization level comprises a plurality of conductive features each having a top surface and a sidewall surface, wherein the top surface of a first conductive feature of the plurality of conductive features has a first average surface roughness and the sidewall surface of a second conductive feature of the plurality of conductive features has a second average surface roughness that is less than the first average surface roughness.

Example 14 includes all of the features of example 13, wherein the second conductive features is electrically coupled to one or more high speed data (I/O) signal conductors within the microprocessor or memory.

Example 15 is a method for making a package substrate, comprising forming a metallization level within a dielectric, wherein the metallization level comprises a plurality of conductive features comprising a first conductive feature and a second conductive feature, each having a top surface and a sidewall surface; and selectively roughening the plurality of conductive features to provide a first average surface roughness for the top surface of the first conductive feature and a second average surface roughness for the sidewall surface of the second conductive feature, wherein the first average surface roughness is not less than 1.5 times the second average surface roughness.

Example 16 includes all of the features of example 15, wherein selectively roughening the plurality of conductive features comprises masking the sidewall surface of the first and second conductive features, wherein the top surfaces of the first and second conductive features are roughened to have the first average surface roughness.

Example 17 includes all of the features of example 15 or 16, wherein selectively roughening the plurality of conductive features comprises masking the sidewall surface of the second conductive features, wherein the top surface of the second conductive features is roughened to have the first average surface roughness, and wherein the top surface and sidewall surface of the first conductive features are roughened to have the first average surface roughness.

Example 18 includes all of the features of any one of examples 15 through 17, wherein selectively roughening the plurality of conductive features comprises depositing a material that is resistant to roughening over the top surface and the sidewall surface of the second conductive feature.

Example 19 includes all of the features of example 18, wherein depositing a material that is resistant to roughening comprises depositing a film comprising a metallic or a dielectric material or a self-assembled monolayer over the top surface and the sidewall surface of the second conductive feature.

Example 20 includes all of the features of any one of examples 15 through 19, further comprising reflowing the top surface and the sidewall surface of the second conductive feature, wherein the top surface and the sidewall surface of the second conductive feature have the second average surface roughness.

Example 21 includes all of the features of example 20, wherein reflowing the top surface and the sidewall surface of the second conductive feature comprise heating by laser the second conductive feature to a temperature at or above the melting point of the second conductive feature.

An abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package substrate, comprising:
    a metallization level within a dielectric material, wherein the metallization level comprises a plurality of conductive features each having a top surface and a sidewall surface,
    wherein the top surface of a first conductive feature of the plurality of conductive features has a first average surface roughness and the sidewall surface of a second conductive feature of the plurality of conductive features has a second average surface roughness that is less than the first average surface roughness,
    wherein the sidewall surface of the first conductive feature has a third average surface roughness that is greater than the second average surface roughness and the top surface of the second conductive feature has a fourth average surface roughness that is less than the first average surface roughness,
    wherein the second conductive feature comprises a first material, and wherein a second material is over the top surface and the sidewall surface of the second conductive feature.

2. The IC package substrate of claim 1, wherein the second material comprises any one of gold, silver, aluminum, nickel, tungsten, cobalt, molybdenum, titanium, carbon, hydrogen, silicon, nitrogen, fluorine, chlorine, or oxygen.

3. The IC package substrate of claim 1, wherein the second material comprises atoms of sulfur and carbon, wherein the atoms of sulfur are covalently bound to the first material, and wherein the atoms of carbon are within an n-hydrocarbon chain comprising at least two atoms of carbon and terminating at an atom of nitrogen, wherein the n-hydrocarbon chain is within a self-assembled monolayer over the top surface and the sidewall surface of the second conductive feature.

4. The IC package substrate of claim 3, wherein the first material comprises copper or an alloy of copper.

5. The IC package substrate of claim 1, wherein the first conductive feature is physically coupled to a via.

6. The IC package substrate of claim 5, wherein the first conductive feature comprises a pad and the via extends over or under the pad.

7. The IC package substrate of claim 1, wherein the first average surface roughness is not less than twice the second average surface roughness.

8. An integrated circuit (IC) package substrate, comprising:
    a metallization level within a dielectric material, wherein the metallization level comprises a plurality of conductive features each having a top surface and a sidewall surface,
    wherein the top surface of a first conductive feature of the plurality of conductive features has a first average surface roughness and the sidewall surface of a second conductive feature of the plurality of conductive features has a second average surface roughness that is less than the first average surface roughness,
    wherein the sidewall surface of the first conductive feature has a third average surface roughness that is greater than the second average surface roughness and the top surface of the second conductive feature has a fourth average surface roughness that is less than the first average surface roughness, and
    wherein the top surface and the sidewall surface of the second conductive feature are substantially curved.

9. The IC package substrate of claim 8, wherein the first conductive feature and the second conductive feature each comprise copper or an alloy of copper.

10. The IC package substrate of claim 8, wherein the second conductive feature comprises an ovoid profile.

11. The IC package substrate of claim 8, wherein the first conductive feature is physically coupled to a via.

12. The IC package substrate of claim 11, wherein the first conductive feature comprises a pad and the via extends over or under the pad.

13. The IC package substrate of claim 8, wherein the first average surface roughness is not less than twice the second average surface roughness.

14. An integrated circuit (IC) package substrate, comprising: a metallization level within a dielectric material, wherein the metallization level comprises a plurality of conductive features each having a top surface and a sidewall surface, wherein the top surface of a first conductive feature of the plurality of conductive features has a first average surface roughness and the sidewall surface of the first conductive feature has a second average surface roughness, wherein the top surface of a second conductive feature of the plurality of conductive features has a third average surface roughness and the sidewall surface of the second conductive feature has a fourth average roughness, wherein the fourth average roughness is less than each of the first, second, and third average roughnesses, wherein an entirety of the top surface of the first conductive feature is roughened, wherein an entirety of the sidewall surface of the first conductive feature is roughened, wherein an entirety of the top surface of the second conductive feature is roughened and an entirety of the sidewall surface of the second conductive feature is smooth.

15. The IC package substrate of claim 14, wherein the first conductive feature and the second conductive feature each comprise copper or an alloy of copper.

16. The IC package substrate of claim 14, wherein the first conductive feature is physically coupled to a via.

17. The IC package substrate of claim 16, wherein the first conductive feature comprises a pad and the via extends over or under the pad.

18. The IC package substrate of claim 14, wherein the first, second, and third average roughnesses are each not less than twice the fourth average surface roughness.

* * * * *